US011848675B2

(12) United States Patent
Gonano et al.

(10) Patent No.: US 11,848,675 B2
(45) Date of Patent: Dec. 19, 2023

(54) ELECTRONIC APPARATUS COMPRISING A SWITCHING-TYPE OUTPUT STAGE, CORRESPONDING CIRCUIT ARRANGEMENT AND METHOD

(71) Applicant: STMicroelectronics S.r.l., Agrate Brianza (IT)

(72) Inventors: Giovanni Gonano, Padua (IT); Marco Raimondi, Busto Garolfo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 18/049,852

(22) Filed: Oct. 26, 2022

(65) Prior Publication Data

US 2023/0076765 A1    Mar. 9, 2023

Related U.S. Application Data

(63) Continuation of application No. 17/350,216, filed on Jun. 17, 2021, now Pat. No. 11,515,861.

(30) Foreign Application Priority Data

Jul. 17, 2020    (IT) .................... 102020000017506

(51) Int. Cl.
*H03K 3/017* (2006.01)
*H03K 5/24* (2006.01)
*H03F 3/217* (2006.01)

(52) U.S. Cl.
CPC ............. *H03K 3/017* (2013.01); *H03F 3/217* (2013.01); *H03K 5/24* (2013.01)

(58) Field of Classification Search
CPC . H03K 3/017; H03K 5/24; H03K 7/08; H03F 3/217; H03F 3/2173; H02M 1/0025;
(Continued)

(56) References Cited

U.S. PATENT DOCUMENTS 6,993,087 B2 * 1/2006 Rosnell .................. H04L 27/20
375/295
7,518,442 B1 * 4/2009 Dijkstra ................ H03F 3/2173
330/10

(Continued)

FOREIGN PATENT DOCUMENTS

| CN | 102037642 A | 4/2011 |
| CN | 104024968 A | 9/2014 |
| WO | 2013067476 A1 | 5/2013 |

OTHER PUBLICATIONS

D'Angelo, R., et al., "Analogue multiplier using passive circuits and digital primitives with time-mode signal representation", Electronics Letters, Oct. 22, 2015, vol. 51, No. 22, pp. 1754-1756.

*Primary Examiner* — John W Poos
(74) *Attorney, Agent, or Firm* — Slater Matsil, LLP

(57) ABSTRACT

An embodiment apparatus comprises a switching-type output power stage, a modulator circuit configured for carrying out a pulse-width modulation and converting an electrical input signal into an input signal pulsed between two electrical levels, having a mean value proportional to the amplitude of the input signal, and a circuit arrangement for controlling saturation of an output signal supplied by the switching-type output power stage. The circuit arrangement comprises a pulse-remodulator circuit, between the output of the modulator circuit and the input of the switching-type output power stage, that is configured for supplying, as a driving signal to the switching-type output power stage, a respective modulated signal pulsed between two electrical levels, measuring a pulse width as pulse time interval elapsing between two consecutive pulsed-signal edges of the pulsed input signal, and, if the measurement indicates that the latter is below a given minimum value, remodulating the pulsed input signal.

20 Claims, 12 Drawing Sheets

(58) Field of Classification Search
CPC ........ H02M 1/0032; H02M 3/04; H02M 3/24; H02M 7/5395; H02M 1/44
See application file for complete search history.

(56) References Cited

U.S. PATENT DOCUMENTS

| | | |
|---|---|---|
| 8,441,316 B2 | 5/2013 | Takagishi |
| 9,065,401 B2 | 6/2015 | Fang et al. |
| 9,929,703 B1 | 3/2018 | Zhao et al. |
| 2006/0044059 A1* | 3/2006 | Yokoyama .............. H03F 3/217 330/103 |
| 2008/0111620 A1* | 5/2008 | Menard ................... H03K 7/08 330/10 |
| 2011/0234187 A1 | 9/2011 | Brown et al. |
| 2012/0153919 A1 | 6/2012 | Garbossa et al. |
| 2013/0222063 A1 | 8/2013 | Bassoli et al. |
| 2015/0340953 A1 | 11/2015 | Shook |
| 2016/0204700 A1 | 7/2016 | Mayer et al. |
| 2019/0007010 A1 | 1/2019 | Hoyerby |

\* cited by examiner

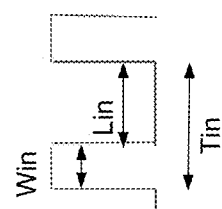
Fig.2
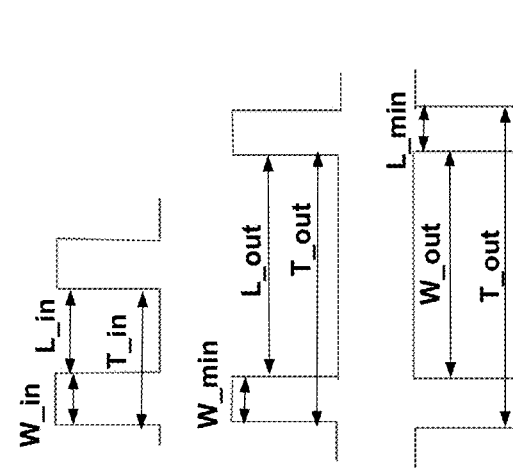
Fig.5
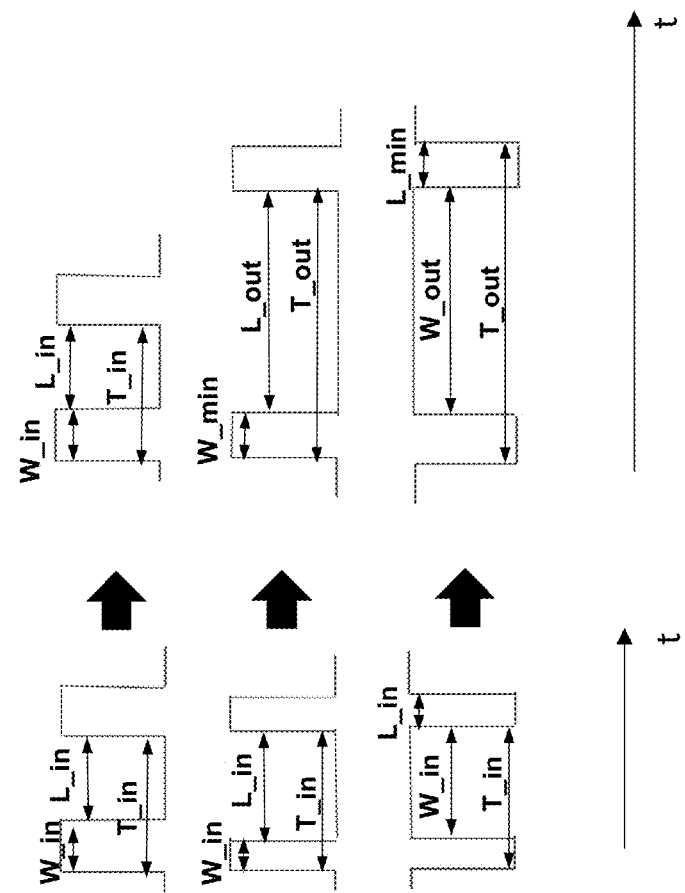
Fig.3A
Fig.3B
Fig.3C

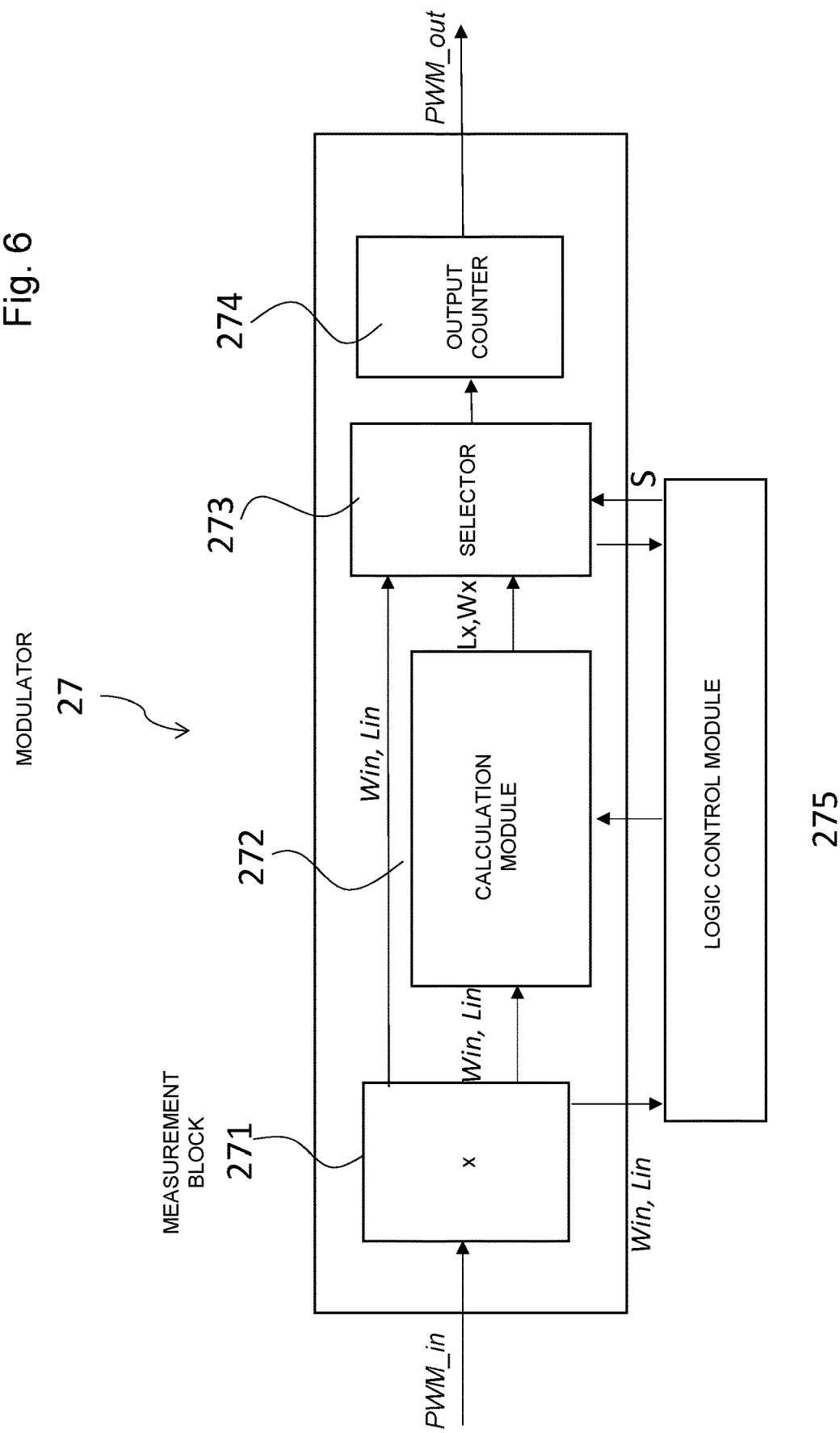

ELECTRONIC APPARATUS COMPRISING A SWITCHING-TYPE OUTPUT STAGE, CORRESPONDING CIRCUIT ARRANGEMENT AND METHOD

CROSS-REFERENCE TO RELATED APPLICATIONS

This application is a continuation application of U.S. patent application Ser. No. 17/350,216, filed Jun. 17, 2021, which application claims the benefit of Italian Application No. 102020000017506, filed on Jul. 17, 2020, which applications are hereby incorporated herein by reference.

TECHNICAL FIELD

The present disclosure relates to techniques for controlling saturation in the output of electronic switching apparatuses.

BACKGROUND

Known to the prior art and widely applied are electronic apparatuses comprising a switching-type output stage such as DC/DC switching converters and class-D audio amplifiers, which comprise a switching power stage of a bridge type, whether a half-bridge type or a full-bridge type.

In this connection, FIG. 1 shows a block diagram of a generic electronic switching apparatus of a bridge type, whether a half-bridge type or a full-bridge type, such as an audio amplifier or a DC-DC converter, designated as a whole by the reference number 10.

An electrical input signal Vi, either analog or digital, in particular a voltage signal, is converted, in the example illustrated via a PWM (Pulse Width Modulation) modulator ii that receives a clock signal CK, into a PWM-modulated input signal, PWM_in, with two electrical levels, corresponding, for example, to the supply voltage VCC and to the ground voltage GND, the mean value of which is proportional to the amplitude of the electrical input signal Vi.

Considering a circuit arrangement of a half-bridge type, but for second-order effects, given a width W of the PWM pulse and its period Tpwm, we have a mean signal:

$$Vout=VCC \cdot W/Tpwm=VCC \cdot D$$

where D is referred to as "modulation index".

The carrier, generally at a fixed frequency, as required in automotive systems, is defined by a clock signal CK supplied to the PWM modulator ii.

The above PWM-modulated input signal PWM_in is supplied at input to a power stage 12, which usually comprises a driver 13 and a switching output power stage 14, in particular, for example, a half-bridge circuit, the high level of which corresponds to the supply voltage VCC, which supplies a switching output power signal, in the example illustrated on two differential outputs, PWM_Pow_P, PWM_Pow_M, even though in variant embodiments it may be a single-end architecture with a single-end output signal PWM_pow, to a filter 15, generally of an LC type, connected then to a load 16, on which an output voltage Vout of the power stage 12 is acquired.

In the case of a full-bridge system in the switching output power stage 14, the two outputs PWM_Pow_P, PWM_Pow_M can benefit from a PWM modulation of a ternary type (in phase) or a binary type (in phase opposition), or of some other type still. In an altogether general way and with obvious modifications for the specific case, the behavior of a stage 14 of a half-bridge type may, for example, be considered here. Both before and after the filter 15, the switching system of a bridge type 10 may further comprise various feedback systems (not represented in FIG. 1) to compensate for the non-idealities of the output stages.

In this context, the automobile market has recently required class-D audio amplifiers and DC/DC converter operating at high switching frequencies. For instance, from the current switching frequency of 350 kHz it is required to operate at a switching frequency of 2.2-2.5 MHz.

The aim of the above requirement is dual: reduce the dimensions of the filter inductances, which for values of switching frequency of 2 MHz can have a lower value and hence smaller dimensions, and improve the performance of regulation, at the same time preventing electromagnetic emissions in the AM band to overcome the corresponding compatibility tests (EMI).

Operating at such high frequencies inevitably leads to negative consequences on control of the output duty cycle.

In particular, reference is here made to the problem of the intrinsic limitations of the rise times or fall times of the switching output signal, Vout in FIG. 1. Considering a current I on the load 16 that passes, at each PWM pulse, from the high-side branch to the low-side branch of the half bridge provided in the stage 14 in a rise time $T_{rise}$ for the rising edge of the PWM power pulse, or a fall time $T_{fall}$ for the reverse passage, i.e., for the falling edge of the PWM power pulse, corresponding to this current I is a certain value of time derivative of the current di/dt through the connections of the package.

On account of the inevitable parasitic inductance of the corresponding wires and pins, there occur overvoltages and undervoltages in the power components of the half bridge 14, also referred to as switches, such as MOS transistors, DMOS transistors, and other similar components.

To prevent any damage to the latter and to the corresponding drivers, the ON/OFF times of these output power components are limited to minimal values, and the respective driver acts on the output power components, modifying the pulses transmitted at output when the input pulses have an amplitude lower than a certain minimum rise/fall time Tmin, which, for example, is generally in the region of 20-50 ns for a package with standard wires having a length of 1 to 3 mm. Below this value, according to the duration of the input pulse, the pulse at output from the system 10 either remains constant at the value of minimum rise/fall time Tmin or is not generated. The same may be said in a dual way for pulses close to positive saturation, considering the logic levels as negated.

Given a period Tpwm of the input pulse and a value of the supply voltage VCC, the minimum (or in a dual way the maximum) signal that can be obtained at output prior to saturation of the output stage 14 is found to be equal to the value of the supply voltage VCC multiplied by the ratio Tmin/Tpwm, or else in a dual way VCC·(1−Tmin/Tpwm), which for switching frequencies of around 2 MHz can reach beyond 20% of the ideal swing.

In what follows, we shall consider the case of minimum pulse (saturation at logic zero). For the case of maximum pulse (saturation at logic one) it is sufficient to consider the negated version of the PWM signal.

Given the impossibility of falling below the minimum rise/fall time Tmin, the efforts in known solutions have concentrated on seeking packages with lower parasitic parameters, a solution that can be applied where the degree of dissipation is sufficiently limited as to be able to occur on the printed circuit board (PCB) by contact with the bottom part of the package (which is of a slug-Down type). Where the presence of a dissipator is instead indispensable, the package must be of a slug-up type, and there does not yet exist a low-cost solution to avoid the presence of bondings/leads.

To improve the behavior in saturation, various control circuits are known based upon feedback circuits that act on the signal upstream, before the modulator. As a result of these compensations and of the effect of sampling of the modulator, there may be various saturation dynamics. If the modulator is of a constant-period PWM type, as the signal increases, it is possible to pass to various dynamic modes: for example, first one output pulse is skipped every two input pulses, modulating the amplitude of the remaining pulse, then two are skipped every three, and so forth.

The intrinsic delays in the actuation and feedback circuits based upon integrators may give rise to undesired spurious transients in the passage from the PWM state with period Tpwm to those with period 2·Tpwm, 3·Tpwm, and so forth.

SUMMARY

Notwithstanding the above extensive activity, there is still felt the need to have available improved solutions, for example as regards extension of the linear field of the high-frequency modulator.

One or more embodiments may refer to class-D audio amplifiers and DC/DC switching converters or switching power supplies.

One or more embodiments may regard a corresponding remodulation device, as well as a corresponding method.

The claims form an integral part of the technical teachings provided herein in relation to one or more embodiments.

As mentioned previously, the present description presents solutions regarding an electronic apparatus comprising a switching-type output power stage, in particular of a full-bridge or half-bridge type, which receives on an input of its own a driving signal pulsed between two electrical levels and supplies at output an output power signal, the electronic apparatus comprising a modulator circuit carrying out a pulse modulation, in particular a pulse-width modulation, configured for converting a DC electrical input signal, or an input signal of a digital type, into an input signal pulsed between two electrical levels, having a mean value proportional to the amplitude of the input signal, a circuit arrangement for controlling saturation of an output signal supplied by the switching-type output power stage, wherein:

the circuit arrangement comprises a pulse-remodulator circuit, set between the output of the modulator circuit and the input of the switching-type output power stage, configured for supplying on an output of its own, as driving signal to the switching-type output power stage a modulated respective signal pulsed between two electrical levels, the pulse-remodulator circuit being configured for:

measuring a pulse width as pulse time interval, which elapses between two consecutive pulsed-signal edges, of the pulsed input signal;

if the measurement of the pulse width indicates that it is below a given minimum value, remodulating the pulsed input signal, imposing a pulse width of the output pulsed signal equal to the value of minimum width and imposing equality between a value of modulation index of the output signal and a value of modulation index of the input signal, applying a lengthening of the output period.

In variant embodiments, the remodulator circuit is configured for:

comparing the value of a pulse width, in particular corresponding to a pulse time interval, which elapses between two consecutive rising and falling edges starting from a rising edge, of the pulsed input signal, with a pulse-width interval defined between a minimum value and a maximum value;

if from the operation of comparison the input pulse width falls within the interval, supplying at output a remodulated signal, an output pulse width of which is equal to a pulse width of the pulsed input signal and an output period of which is equal to an input period; in particular, the remodulated signal corresponds to the pulsed input signal; in particular, it is delayed by a fraction of the input period;

if from the operation of comparison the input pulse width is less than the minimum value, supplying at output a remodulated signal, where the output pulse width is equal to the minimum value and the output period is equal to the input period multiplied by the ratio between the minimum width and the input width;

if from the operation of comparison the input pulse width is greater than the maximum value, supplying at output a remodulated signal, where the difference between the output period and the output pulse width, equal to the width of the negated output pulse, in particular corresponding to a pulse time interval, which elapses between two consecutive rising and falling edges starting from a falling edge, at output, is set equal to the difference between the input period and the maximum value, which is equal to the width of the negated pulse of maximum width, and the output period is equal to the input period multiplied by the ratio between the difference between the input period and the maximum value and the difference between the input period and the input pulse width.

In variant embodiments, the above pulse-remodulator circuit is configured for calculating the output pulse width as a function of the width of the negated input pulse and of the width of the negated output pulse.

In variant embodiments, the aforesaid pulse-remodulator circuit comprises:

a measurement module configured for measuring the width of the input pulse and the width of the negated input pulse;

a selector, which receives the pulse-width values measured by the measurement module;

a logic control module, which receives the measured pulse-width values from the measurement module;

a module for calculating a recalculated width and a negated recalculated width; and a logic control module, configured for checking whether the pulse-width value of the input signal lies outside the pulse-width interval and for governing the selector module to select, as a function of the result of the check, whether to use the input widths or the recalculated widths as value supplied to an output counter, which generates the remodulated signal.

In variant embodiments, the pulse-remodulator circuit comprises a logic control module, which receives the input signal,
  the remodulator circuit further comprising a comparator and multiplier module, which receives the input signal and is configured for:
  comparing the minimum width and the input width and generating a switching signal for the logic control module, and
  generating a modified signal having a pulse of minimum width and a period determined by imposing equality between the product between the minimum width and the width of the negated input pulse and the product between the period and the width of the input pulse,
  the logic control module selecting as output signal one between the input signal and the signal modified as a function of the switching signal.

In variant embodiments, the above apparatus comprises a sign-detector module, configured for changing the logic state of its own output according to whether the pulse width is above or below a sign-switching value, in particular half of the period of the input signal, and circuit means for negating the input signal as a function of the logic state of the output of the sign detector.

In variant embodiments, the apparatus is a class-D amplifier.

In variant embodiments, the limits of the interval amount to one and the same fraction of the period of the pulsed input signal.

In variant embodiments, the pulse-remodulator circuit is configured for dynamically changing the limits of the interval as a function of the duration of a minimum rising/falling pulse of the switching output stage.

In variant embodiments, the value of minimum input pulse width is greater than or equal to the sum of the rise and fall times of the edges of the pulse of the output power signal.

The present description also relates to a circuit arrangement comprising a pulse-remodulator circuit, configured for receiving an input signal pulsed between two electrical levels and supplying on an output of its own a respective remodulated signal pulsed between two electrical levels, the pulse-remodulator circuit being configured for remodulating the pulsed input signal if the pulse-width value of the input signal is below a given value of minimum width or lies outside a given pulse-width interval, imposing the pulse width of the output signal equal to the value of minimum width and imposing equality between a value of modulation index of the output signal and a value of modulation index of the input signal, applying a lengthening of the output period.

The present description also relates to a method for controlling an electronic apparatus according to any one of the preceding embodiments, comprising:
  carrying out a pulse modulation and converting the continuous or digital electrical input signal into the input signal pulsed between two electrical levels, having a mean value proportional to the amplitude of the input signal; and
  controlling saturation of an output signal supplied by the switching-type output stage,
  wherein:
  controlling saturation of an output signal supplied by the switching-type output stage comprises an operation of remodulation of the pulse of the input signal pulsed between two electrical levels for supplying a respective remodulated signal pulsed between two electrical levels, the remodulation operation comprising:
    measuring a pulse width as pulse time interval, which elapses between two consecutive pulsed-signal edges, of the pulsed input signal,
    if the measurement of the pulse width indicates that it is below a given minimum value, remodulating the pulsed input signal by imposing equality between a pulse width of the output pulsed signal and the value of minimum width and imposing equality of a value of modulation index of the output signal and a value of modulation index of the input signal, applying a lengthening of the output period.

In variant embodiments, the above method comprises calculating the output pulse width as a function of the width of the negated input pulse and of the width of the negated output pulse.

In variant embodiments, the method comprises:
  measuring values of width of the input pulse and of width of the negated input pulse;
  calculating a recalculated width and a negated recalculated width;
  checking whether the pulse-width value of the input signal lies outside the pulse-width interval; and
  selecting, according to the result of the check, whether to use the input widths or the recalculated widths as value supplied to an output counter that generates the remodulated signal.

In variant embodiments, the above method comprises:
  comparing the minimum width and the input width and generating a switching signal for the logic control module;
  generating a modified signal having a pulse of minimum width and a period determined by imposing equality between the product between the minimum width and the width of the negated input pulse and the product between the period and the width of the input pulse; and
  selecting as output signal one between the input signal and the modified signal, as a function of the switching signal.

One or more embodiments may afford one or more of the following advantages:
  extending the linear field of the modulator at high frequency;
  operating with the circuit arrangements presented above that are independent of the electrical parameters of the real elements considered and mostly independent of the mismatch between homologous components;
  operating with a continuous spectrum; and
  communicating to the outside world in a precise way the condition of saturation of the apparatus.

BRIEF DESCRIPTION OF THE DRAWINGS

One or more embodiments will now be described, purely by way of non-limiting example, with reference to the annexed drawings, wherein:
FIGS. 2, 3A, 3B, 3C, and 5 illustrate timing diagrams of pulsed signals on which the solutions described herein operate;
FIG. 6 illustrates a first embodiment of a module operating in the circuit arrangement according to the solutions described herein;

DETAILED DESCRIPTION OF ILLUSTRATIVE EMBODIMENTS

In the ensuing description various specific details are illustrated in order to provide an in-Depth understanding of various examples of embodiments according to the description. The embodiments may be obtained without one or more of the specific details, or with other methods, components, materials, etc. In other cases, known structures, materials, or operations are not illustrated or described in detail so that various aspects of the embodiments will not be obscured. Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in various points of the present description do not necessarily refer exactly to one and the same embodiment. Moreover, particular conformations, structures, or characteristics can be combined in any adequate way in one or more embodiments.

The references used herein are provided merely for convenience and hence do not define the sphere of protection or the scope of the embodiments.

Solutions proposed are described herein with reference to PWM apparatuses, such as the bridge-type electronic switching apparatus 10 described with reference to FIG. 1, but the solutions are applicable to other cases of pulse-width modulation, in general to switching apparatuses comprising a modulator, for example the PWM modulator ii, configured for converting an input signal, for example the input signal Vi, which is a DC electrical signal, but in variant embodiments can be a digital signal, into an input signal, for example the PWM input signal PWM_in, pulsed between two electrical levels, in particular two voltage levels, the mean value of which is proportional to the amplitude of the input signal Vi, and a switching-type output power stage, comprising, in particular, a full bridge or a half bridge, which receives on its own input the input signal PWM_in pulsed between two levels, usually with interposition of a driver circuit for driving the switching power stage.

Solutions described herein are based upon a fundamental principle, common to PWM systems, which envisages (once again with reference to FIG. 1) modelling, to the first order of approximation, of the output voltage Vout, which, neglecting residual oscillations and losses due to the drain-to-source on-state resistance and the non-ideal switching edges, is a mean voltage that, as has been said, is preferably filtered, as follows:

$$Vout = VCC \cdot W/Tpwm = D \cdot VCC \quad (1)$$

Figure 1:
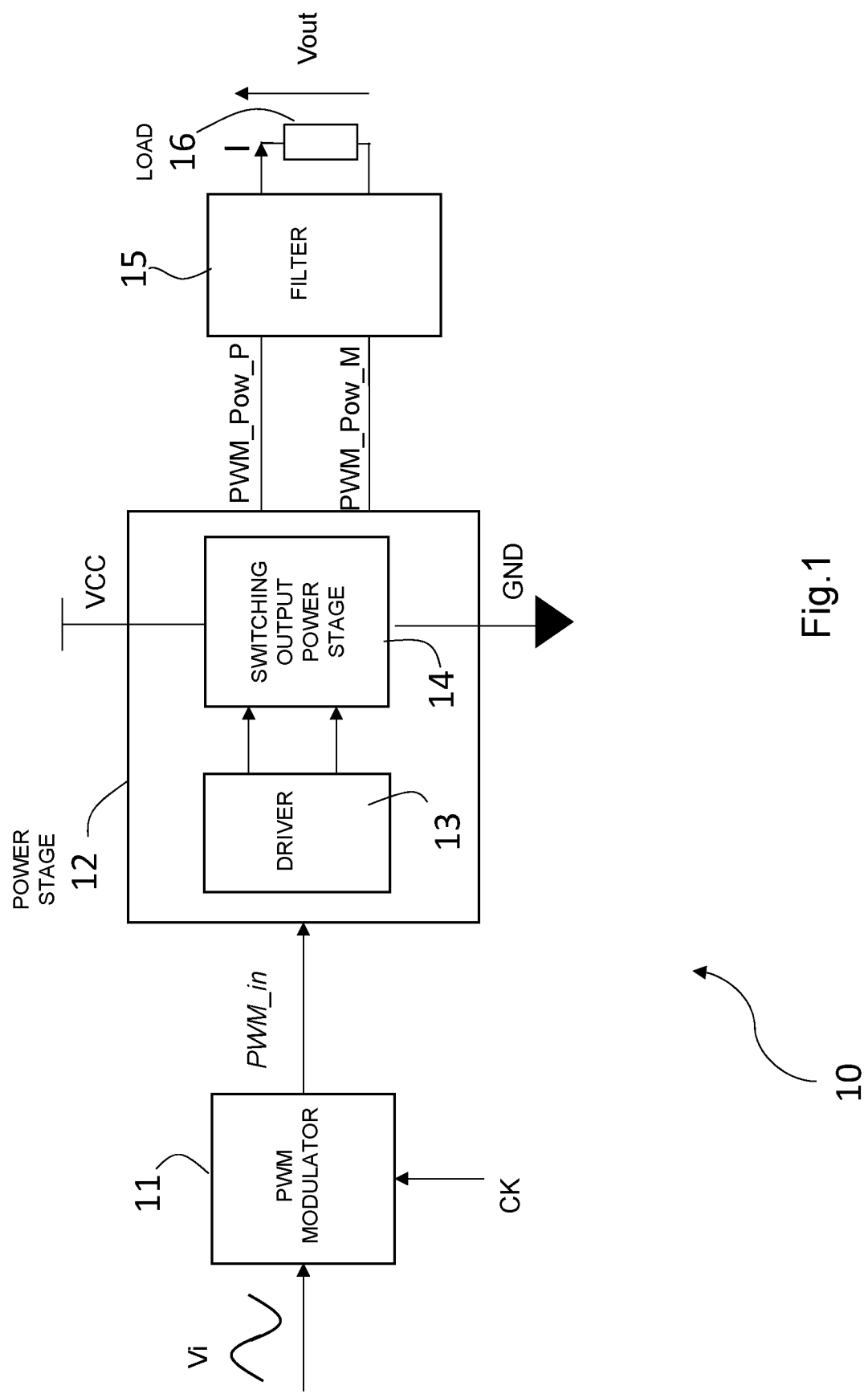
FIG. 1 illustrates a block diagram of a generic electronic switching apparatus of a bridge type.

In the approximation generically indicated for switching systems, where the frequency of the PWM pulses, Fpwm=1/Tpwm, has values reasonably beyond (generally by a factor of 10) the cut-off frequency of the demodulator filter, i.e., the filter 16 in FIG. 1, and the resulting voltage ripple is acceptably low, given a certain value of supply voltage VCC there exists a wide range of pairs of values of pulse width Wand period Tpwm that determine the same modulation index D and the same value of mean output voltage Vout.

This can be expressed as follows:

$$\text{if: } W_o/Tpwm_o = W_X/Tpwm_X$$

$$\text{then: } Vout_o = Vout_X \quad (1.1)$$

where the subscripts o and x indicate two generic pairs of values of pulse width Wand period Tpwm; by convention, here the subscript x indicates an unknown pair obtained from the known pair, with subscript o. For instance, in what follows $W_X$ will be referred to as "calculated or measured pulse width".

Taking into account:

that for a system with high switching frequency, the frequency ratio with respect to the audio band, in particular between the modulation frequency Fpwm and the upper limit of the audio band at 20 kHz, is greater than 100, and that in the proximity of saturation the output ripple is lower than at half amplitude, the frequency modulation can be reduced to 300 kHz with a traditional demodulation filter of a 1 µH-1 µF type, guaranteeing a sufficient attenuation of the off-band harmonics.

Figure 4:
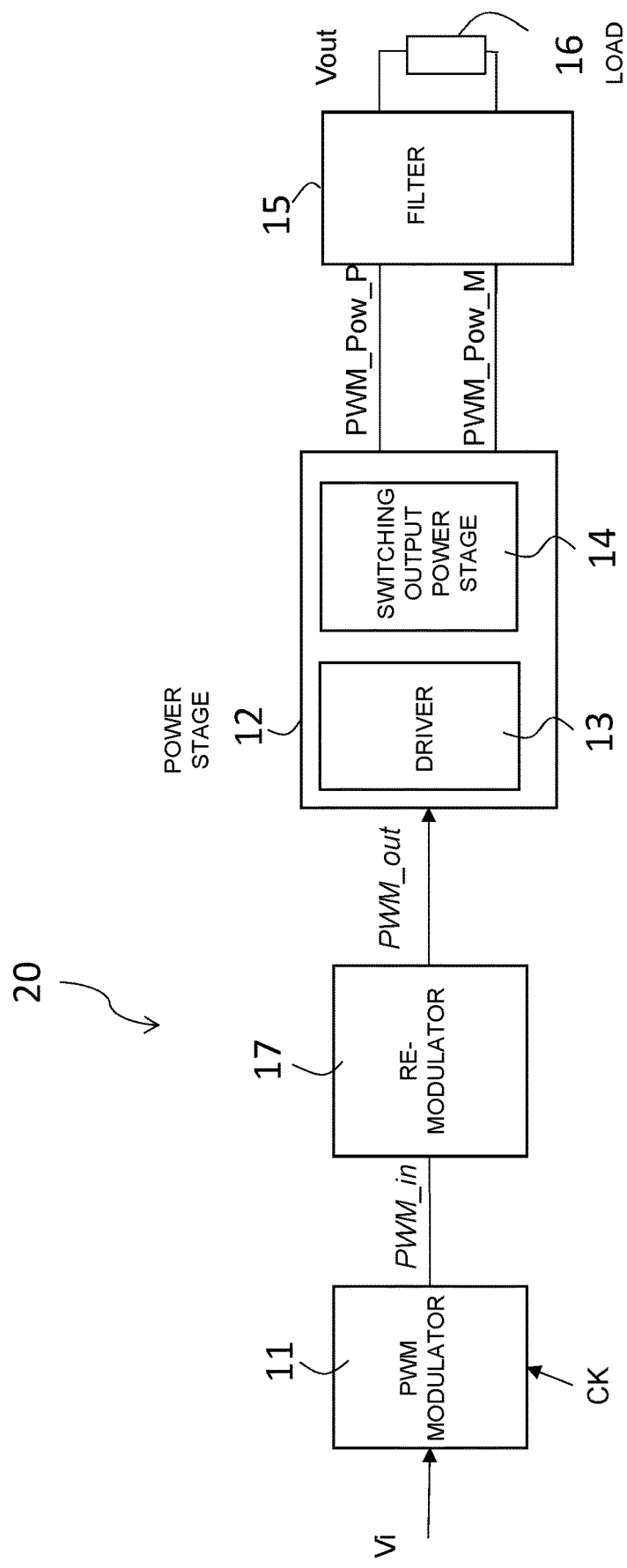
FIG. 4 illustrates a diagram of a circuit arrangement according to the solutions described herein.

Represented in FIG. 4 is a block diagram that illustrates an electronic switching apparatus 20 according to the solutions described herein. This electronic switching apparatus 20 basically corresponds to the electronic switching apparatus 10 of FIG. 1, and in this context the blocks bearing the same reference numbers designate elements that are analogous to and have the same function as those of FIG. 1. However, in addition to the analogous elements, the embodiment 20 of electronic switching apparatus further comprises a pulse-remodulator circuit block (or modulator-reshaper circuit block), designated by 17 in the diagram of FIG. 4 and referred to hereinafter for brevity as remodulator 17, which receives at input the PWM input signal PWM_in with constant period generated by the modulator ii and supplies at output to the power stage 12 and, in particular, to the switching stage 14, through the drivers 13, a PWM output signal PWM_out.

The above remodulator 17 is configured for remodulating the PWM input signal PWM_in, i.e., modifying the durations of the pulses of the PWM output signal PWM_out on the basis of those of the PWM input signal PWM_in.

In general, the remodulator 17 performs the above remodulation on the basis of a value of input pulse width $W_{in}$ of the PWM input signal PWM_in, generating a PWM output signal PWM_out having the same modulation index D as the PWM input signal PWM_in, i.e., $W_{out}/TPWM\_out = W_{in}/Tpwm$, whereas the period of the PWM output signal PWM_out is lengthened so as to allow the signal at output from the PWM power stage PWM_pow to perform the transitions, of non-negligible duration, i.e., $T_{rise}$ and $T_{fall}$, necessary for maintaining the same modulation index D of the PWM input signal PWM_in.

In other words, this means that a value of minimum input pulse width $W_{min}$ is set that is greater than or equal to the sum of the rise and fall times, $T_{rise}$ and $T_{fall}$, of the edges of the pulse of the signal at output from the PWM power stage PWM_Pow.

The value of input pulse width $W_{in}$ is compared with the value of minimum input pulse width $W_{min}$ and if this value of input pulse width $W_{in}$ is lower, there is imposed equality between the output width and the minimum width and equality between the modulation indices of the input signal and the output signal so as to allow the PWM output signal PWM_out to perform the transitions, of non-negligible duration, and, by virtue of the condition of equality of the modulation indices of Eq. 1 and Eq. 1.1, a lengthening of the output period $T_{out}$ is applied.

In mathematical terms:

$$W_{out}=W_{min}>T_{rise}+T_{full},$$

$$D_{in}=D_{out} \rightarrow W_{in}/T_{in}=W_{out}/T_{out} \rightarrow T_{out}=T_{in} \cdot W_{out}/W_{in}.$$

The criterion of comparison of the value of input pulse width $W_{in}$ with the value of minimum input pulse width $W_{min}$ can be formulated as:

$$W_{min}=T_{rise}+T_{full}<W_{in}$$

And, if also the upper limit of the input pulse width is evaluated, as:

$$W_{min}=T_{rise}+T_{full}<W_{in}<T_{in}-T_{rise}+T_{full}=T_{in}-W_{min}=W_{max}$$

where $W_{min}$ and $W_{max}$ denote respective minimum and maximum values of pulse width, $W_{in}$ and $W_{out}$ denote the pulse widths of the PWM input signal PWM_in and of the PWM output signal PWM_out, respectively, and $T_{in}$ and $T_{out}$ are the respective periods.

In what follows, the pulse width W is defined as the time interval elapsing between two consecutive pulse edges, i.e., edges of transition between the two electrical levels, which may be rising or falling edges, this interval starting with a rising edge.

Likewise, the negated pulse width L, i.e., the pulse width of the negated pulsed signal, is defined as time interval elapsing between two consecutive pulse edges, i.e., edges of transition between the two electrical levels, which may be a rising edge or a falling edge, this interval starting with a falling edge.

The above remodulation is applied if the value of pulse width $W_{in}$, in particular corresponding to a time interval that elapses between two consecutive rising and falling edges of the input signal and that starts with a rising edge, is below the minimum width $W_{min}$ or lies outside a given pulse-width interval [$W_{min}$, $W_{max}$]; instead, the PWM input signal PWM_in and the PWM output signal PWM_out correspond as regards period and modulation index, because the input pulse width $W_{in}$ is such as to allow rising and falling edges with the minimum times $T_{rise}+T_{full}$.

More specifically, in the example of FIG. 4, the remodulator 17 generates a PWM output signal PWM_out defined, starting from Eq. 1, as follows:

for $W_{min} \leq W_{in} \leq W_{max}$ $$W_{out}=W_{in} \text{ and } T_{out}=T_{in} \quad (2.1)$$

for $W_{in}<W_{min}$ $$W_{out}=W_{min} \text{ and } T_{out}=T_{in} \cdot W_{min}/W_{in} \quad (2.2)$$

for $W_{in}>W_{max}$ $$L_{out}=L_{min} \text{ and } T_{out}=T_{in} \cdot L_{min}/L_{in} \quad (2.3)$$

where $W_{min}$ and $W_{max}$ denote respective minimum and maximum values of pulse width, $W_{in}$ and $W_{out}$ are the pulse widths of the PWM input signal PWM_in and the PWM output signal PWM_out, respectively, $T_{in}$ and $T_{out}$ are the respective periods, while $L_{out}=T_{out}-W_{out}$, i.e., it is equal to the difference between the output period and the output pulse width, i.e., equal to the width of the negated output pulse, and $L_{in}=T_{in}-W_{in}$, i.e., it is equal to the difference between the input period and the input pulse width, i.e., equal to the width of the negated input pulse, as also illustrated in the diagram of FIG. 3C. The minimum width of the negated pulse $L_{min}$, is preferably equal to $W_{min}$, i.e., $T_{in}-W_{max}$. In other words, if from the operation of comparison it is found that the input pulse width $W_{in}$ is greater than the maximum value $W_{max}$, it is envisaged to supply at output a remodulated signal PWM_out, where the difference between the output period $T_{out}$ and the output pulse width $W_{out}$, which is equal to the negated output pulse width $L_{out}$, is imposed as being equal to the difference between the input period $T_{in}$ and the maximum value $W_{max}$, which is equal to the width $L_{min}$ of the negated pulse of maximum width, and the output period $T_{out}$ is equal to the input period $T_{in}$ multiplied by the ratio between the difference between the input period $T_{in}$ and the maximum value $W_{max}$ and the difference between the input period $T_{in}$ and the input pulse width $W_{in}$.

Preferably, in the embodiments of the remodulator 17, 27, 37, 37' described hereinafter, the minimum width $W_{min}$ is equal to the sum of the minimum rise time $T_{rise}$ and the minimum fall time $T_{full}$ of the output signal PWM_pow of the power stage 14. Preferably, moreover, the value of the minimum width $W_{min}$ is equal to the value of the input period minus the maximum width $W_{max}$. In variant embodiments, it may become necessary to distinguish between the value of the minimum width $W_{min}$ and that of the width of the negated pulse of maximum width $L_{min}=T_{in}-W_{max}$ in the case of asymmetries between the switching edges.

With reference to FIG. 3A, Eq. 2.1 corresponds to operating with constant period, where the pulse of the original PWM input signal PWM_in and the pulse of the PWM output signal PWM_out correspond as regards value of pulse width and period.

Eqs. 2.2 and 2.3, the quantities of which are represented in FIGS. 3B and 3C, respectively, correspond to operating with variable period, where the period $T_{out}$ of the PWM output signal is obtained by multiplying the input period $T_{in}$ by the ratio $W_{in}/W_{min}$ (Eq. 2.2) or else by the ratio $L_{in}/M_{min}$ (Eq. 2.3), and setting the output width $W_{out}$ at the minimum width $W_{min}$, or respectively the output width $L_{out}$ of the negated pulse at the respective minimum value $L_{min}$.

In other words, the remodulator block 17 is configured for comparing at each clock cycle the value of the pulse width $W_{in}$, in particular corresponding to a time interval elapsing between two consecutive rising and falling edges, which starts with a rising edge of the input signal PWM_in, with an interval defined by the minimum value $W_{min}$ and the maximum value $W_{max}$.

If the input pulse width $W_{in}$ falls within the above interval, the output signal coincides with the input signal; i.e., the pulse width of the output signal is equal to the width $W_{in}$ of the input signal, and the input period $T_{in}$ and the output period $T_{out}$ are equal to one another;

if the input pulse width $W_{in}$ is less than the minimum value $W_{min}$, the output pulse width $W_{out}$ is set at the minimum value $W_{min}$ and the output period $T_{out}$ is equal to the input period $T_{in}$ multiplied by the ratio between the minimum width $W_{min}$ and the input width $W_{in}$;

if, instead, the input pulse width $W_{in}$ is greater than the maximum value $W_{max}$, the width of the negated pulse, in particular corresponding to a time interval elapsing between two consecutive rising and falling edges that starts with a falling edge, at output $L_{out}$ is set equal to the minimum width of the negated pulse $L_{min}$, which is generally equal to $W_{min}$, and the output period $T_{out}$ is equal to the input period $T_{in}$ multiplied by the ratio between the difference between the input period $T_{in}$ and the maximum value $W_{max}$ and the difference between the input period $T_{in}$ and the input pulse width $W_{in}$; i.e., the output period $T_{out}$ is equal to the ratio between the minimum negated-pulse width $L_{min}$ and the input negated-pulse width $L_{in}$.

Preferably, but not necessarily, the limits $W_{min}$, $W_{max}$ of the interval $[W_{min}, W_{max}]$ amount to one and the same function of the period $T_{in}$ (or Tpwm) of the pulsed input signal PWM_in, i.e., $W_{max}=T_{in}-W_{min}$, i.e., $L_{min}=W_{min}$. In this condition, as will also be discussed in what follows, it is possible to implement circuits that for example operate only on Eq. 2.2, treating the case of minimum width $W_{min}$, and use the same circuit for Eq. 2.3, simply negating the pulsed input signal PWM_in supplied to the remodulator 17, i.e., using $\overline{PWM\_in}$ and then, once an output signal has been obtained, yielding as final result the negated version of the output signal thus obtained.

The three operations 2.1, 2.2, 2.3 for the three cases determined by the value of the input pulse width $W_{in}$ as compared to the interval $[W_{min}, W_{max}]$ that are executed by the remodulator 17 are illustrated in the timing diagrams of FIGS. 3A, 3B, 3C, which exemplify the pulses PWM_in at input to the remodulator 17 and the pulses PWM_out at output from the remodulator 17 as a function of the time t.

Possibly, the period Tout of the PWM output signal PWM_out may be limited, via a filter on the signal PWM_in, to a maximum acceptable value beyond which the switching system 20 is caused to saturate, at the value of the ground voltage GND or at the value of the supply voltage VCC, considering the output demodulation filter 16 and the specifications of off-band emission.

Operating with switching systems in the automotive field, where the electromagnetic emissions must respect a precise emission mask, at first sight it could be considered disadvantageous to modify the frequency of the modulating signal.

This contraindication, however, is significant only when the signal is not close to saturation. In the case of traditional constant-frequency pulse-width modulators, in fact, it is known that, when the power stage 14 passes from the linear zone (fixed-frequency switchings) to the saturated zone, there is a transient in which the periodicity of the output pulses is lost, and consequently the radiation falls beyond the band around the modulation frequency Fpwm and its higher harmonics.

While, as mentioned previously, traditional saturation-control systems generate emission peaks concentrated at submultiples of Fpwm (Fpwm/2, Fpwm/3, Fpwm/4, and so forth), the system described herein generates an emission that, even though it exits from the band centered around the modulation frequency Fpwm, has a continuous spectrum: according to the solutions described herein, the modulation frequency Fpwm is in turn modulated, for example, as a function of how much the input pulse width $W_{in}$ drops below the minimum value $W_{min}$ (Eq. 2.2), determining a spectrum of emission with less marked maxima in so far as the energy is distributed over a more extensive frequency band.

In some embodiments, the electronic switching apparatus according to a solution described herein is configured for being able to change dynamically the minimum value $W_{min}$ in specific cases, where, for example, the speed of the power stage 12, i.e., output driver, and hence the minimum pulse duration, changes over time for various reasons (temperature, aging, or variation of other system parameters).

In the ensuing treatment, with reference to the figures, by Tpwm it is possible denote, according to the implementation, the modulating period $T_o$ (which is possibly constant, as in the case of Eq. 2.1) or the time interval between two rising edges, hence $T_{in}=W_{in}+L_{in}$, as shown in FIG. 5, which represents the input pulse, i.e., a pulse of the signal PWM_in, where $L_{in}$ is the width of the negated pulse, i.e., of a pulse of the negated PWM input signal $\overline{PWM\_in}$, or again in other words the time interval between the falling edge of one pulse and the rising edge of the next.

It is known that the period $T_o$ of the modulating signal and the time interval between two rising edges in the PWM signal do not coincide exactly in general, as for example in PWM systems with double-edge triangular modulating signal, unless the input signal is constant. In what follows, an operating mode is described for updating the quantities at input for the processing operations using the latest available samples of the widths $W_{in}$, $L_{in}$ or of the period $T_{in}$ of the input signal PWM_in.

In general, in some of the embodiments suggested, it is possible to obtain a simplification if for the calculation of the PWM output signal PWM_out the time interval between two rising edges is approximated as being constant, possibly at the expense of introduction of a slight distortion.

Since in the present description it is a system that is activated upon events of saturation due to the nonlinearities of the driver, the distortions introduced are of a negligible degree as compared to those that there would be otherwise, and can be more easily compensated in the case where the system is a feedback system.

The various possibilities of implementation depend upon the specifications of the system (frequency Fpwm of the modulating signal and minimum pulse width $W_{min}$), upon the means used (digital means or analog means, type of CMOS technology, etc.), and upon the possible way in which Eqs. 2.2 and 2.3 with which to obtain the PWM output signal PWM_out in the case of saturation are re-written.

It is sufficient to treat the case of Eq. 2.2 when $W_{in}<W_{min}$, in so far as the Eq. 2.3 is obtained by computing the negated input pulse using the same relations as those of Eq. 2.2, and yielding at output the negated version of the signal thus obtained.

There exist two possible procedures for implementation, both of which can be applied.

It is possible to use a calculation procedure that, together with the input pulse width $W_{in}$, uses, as input variable, instead of the period $T_{in}$ of the input signal the pulse width of the negated signal, namely the time interval between the falling edge of one pulse and the rising edge of the next pulse L, which for the input signal is $L_{in}$.

Substituting the period T with the above quantities W, L, in Eq. 1 we obtain:

$$W_{in}/(W_{in}+L_{in})=W_{min}/(W_{min}+L_{out})$$

hence, by simplifying, we obtain:

$$W_{in}/W_{min}=L_{in}/L_{out}$$

In this case, there is a faster dynamic of updating of the input variables of the system, the pulse width $W_{in}$ and the pulse width of the negated signal $L_{in}$, with consequent reduced distortion in the transformation, at the expense of a greater complexity of implementation.

Alternatively, it is possible to use a calculation procedure that will not resort to divisions, but that will obtain the output period $T_{out}$ via the comparison of the two products resulting from Eq. 2.2, $T_{out} \cdot W_{in}$ and $T_{in} \cdot W_{min}$, or from Eq. 2.3 by applying the quantities referred to in point a), $L_{out} \cdot W_{in}$ and $L_{in} \cdot W_{min}$, varying the unknown $T_{out}$ starting from zero until equality is reached.

Described by way of example in what follows are:
a first embodiment (FIG. 6) implemented with digital means, starting from the formula obtained from Eq. 1 in the condition a):

$$W_{in} = W_{min} \cdot L_{in}/L_{out} \qquad (3.1)$$

a second embodiment (FIG. 11) implemented with analog means starting from application of the conditions a) and b) to the calculation of the pulse width of the negated output signal $L_{out}$ in the formula:

$$L_{out} \cdot W_{in} = L_{in} \cdot W_{min} \qquad (3.2)$$

As regards the first embodiment of the remodulator 17, it is illustrated schematically in FIG. 6 and designated as a whole by the reference 27. It envisages obtaining a structure consistent with Eq. 3.1 measuring, in a block 271, the duration of the pulses $W_{in}$ and $L_{in}$ of the input signal PWM_in, which are supplied to a selector 273 controlled by a logic control module 275, which receives from the measurement block 271 the pulse durations $W_{in}$ and $L_{in}$. This step is facilitated in the case of a modulator managed in a completely digital way in so far as these parameters are already directly available.

The durations, i.e., the widths in the time domain, of the input pulse $W_{in}$ and of the negated input pulse $L_{in}$ are supplied, for example by the module 271, to a module 272 configured for calculating a recalculated width $W_X$ and a negated recalculated width $L_X$ on the basis of the relation 3.1, i.e., calculating $$L_X = L_{in} \cdot W_{min}/W_{in}$$

and/or $$W_X = W_{in} \cdot W_{min}/L_{in}$$

The logic control module 275 compares the, i.e., the widths in the time domain, of the input pulse $W_{in}$ and of the negated input pulse $L_{in}$ with the minimum admissible width $W_{min}$ set and possibly enables the calculation module 272.

In addition, the logic control module 275, via the selector 273, establishes which parameters to use, whether the input ones $W_{in}$, $L_{in}$ or the recalculated ones $W_X$, $L_X$ in an output counter 274, which generates the output signal PWM_out to be supplied to the stage 12, specifically to the stage 14 through the driver 13.

The output signal PWM_out is completely asynchronous with respect to the input when the amplifier is in saturation, whereas otherwise the input signal PWM_in is equal to the output signal PWM_out, but for a delay equal to a fraction of the modulation frequency Fpwm.

Figure 9:
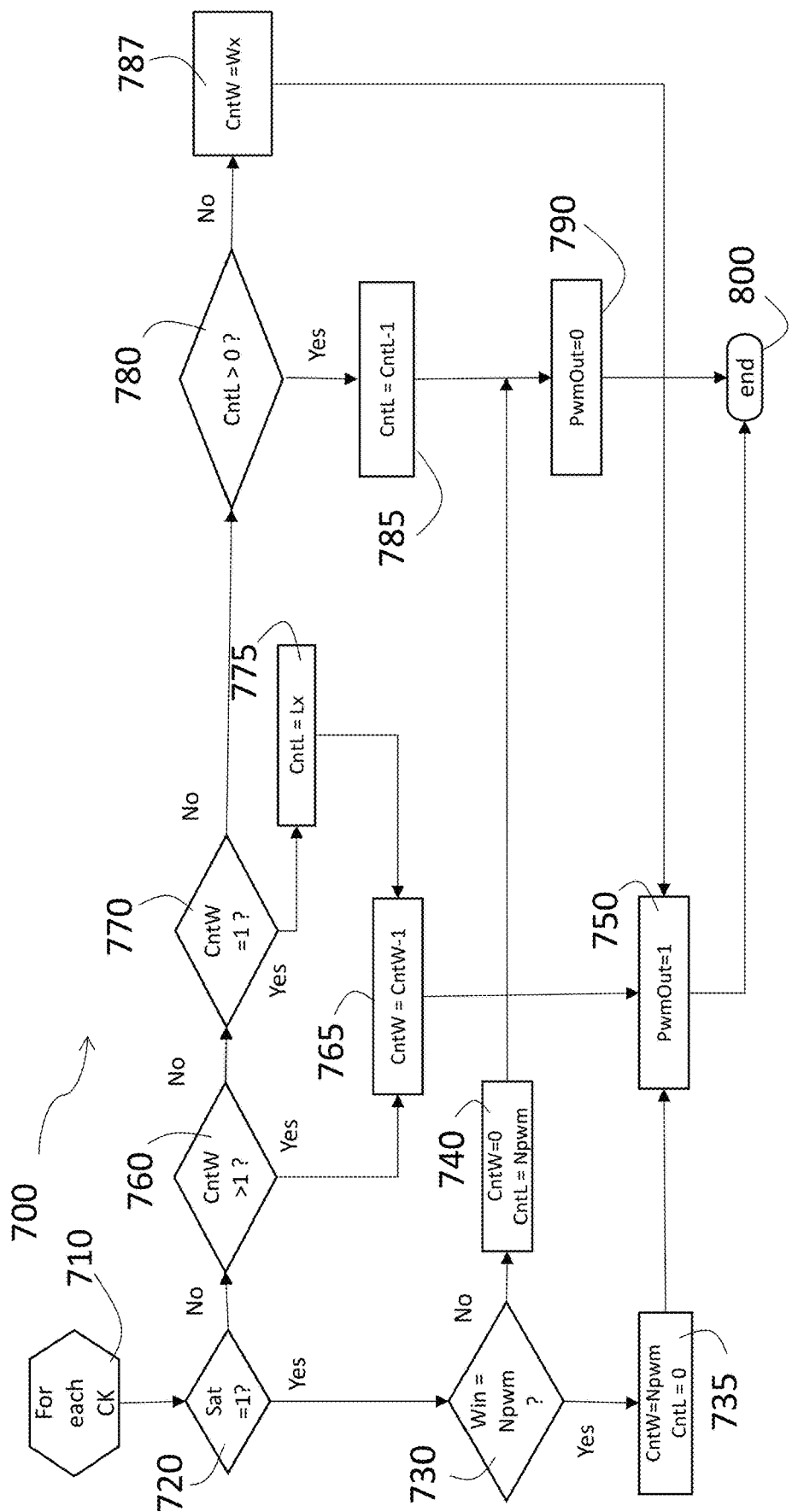
Figure 10:
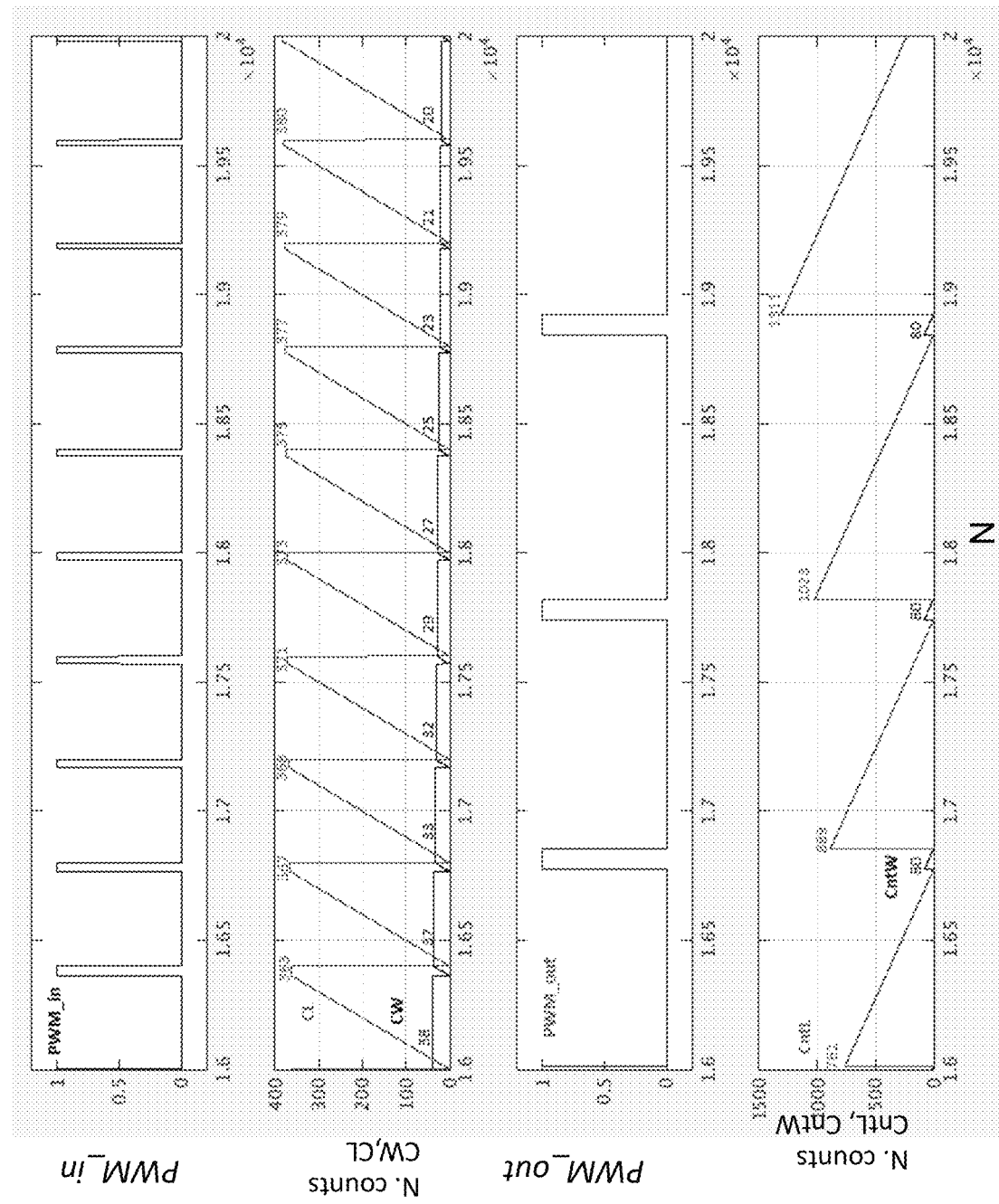
FIG. 10 illustrates timing diagrams of signals used by the module of FIG. 6.

The output counter 274 uses the values $W_X$, $W_{in}$ for measuring the width of the input pulse PWM_in, and the values $L_X$, $L_{in}$ for measuring the width of the negated pulse, as exemplified in what follows with reference to the procedure 700 of FIG. 9 and to the diagrams of FIG. 10, which show, in particular, the evolutions of the values of the internal counters CntW and CntL in block 2873 and the signal PWM_out accordingly remodulated by the modulator 27 in block 273.

For implementation of the modulator 27, it is possible to resort either to analog means or to digital means.

In the latter case, it is necessary to implement counters, dividers, and multipliers having available a system clock with a sufficiently high frequency (clock frequency Fck>10/$W_{min}$), which will enable management of the switching times with an adequate temporal discretization.

In the modulator described, there may be applied in an altogether general way dithering and noise-shaping techniques, and/or division of the system clock using delay chains for making up for the time discretization. In what follows, in order to simplify the description, use of such techniques is not, however, described, even though it falls within the scope of the solutions described herein. The embodiment of the modulator 27 has a discrete-time output, but can have either a discrete-time input or a continuous-time input.

In the latter case, discretization is obtained through suitable analog-to-Digital conversion modules.

Figure 7:
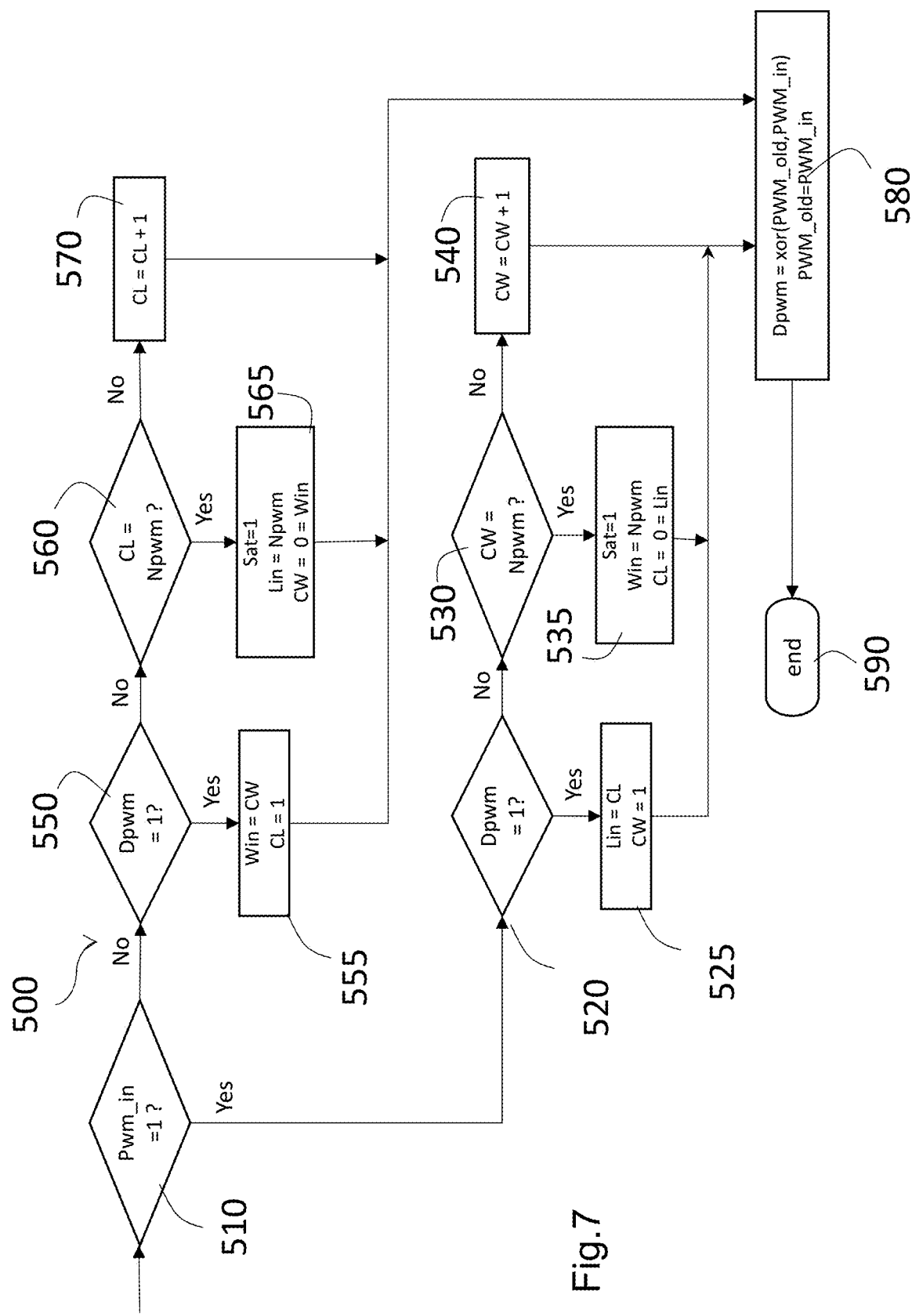
FIGS. 7, 8, and 9 illustrate flowcharts of operations implemented by the module of FIG. 6.

Illustrated in FIG. 7 is the flowchart of a first part 500 of a modulation procedure 500 regarding a digital implementation, i.e., with discrete-time input and output, for the embodiment of the modulator 27 of FIG. 6. The other parts are described with reference to the flowcharts 600 and 700 of FIGS. 7 and 8.

Hence, in the first part 500, at startup, a check is made (in a step 510) as to whether the input signal PWM_in has a high logic value. Furthermore, the transition variable Dpwm is defined as XOR operation between the PWM input signal PWM_in at the current instant and the PWM input signal PWM_in at the previous tick of the clock, denoted as PWM_old, so as to indicate the transition from 0 to 1 or from 1 to 0 of the input signal PWM_in.

In the case where PWM_in=1, in a step 520 a check is made as to whether the transition variable Dpwm is equal to 1.

If it is, in a step 525, the pulse width of the negated signal $L_{in}$ is set at the value of a width-counter variable of the negated signal CL and a width-counter variable CW is set at 1, i.e., $$L_{in} = CL$$

$$CW = 1$$

In other words, from steps 510 and 520 it emerges that there has been a transition from 0 to 1. Hence, the pulse width of the negated signal $L_{in}$, which is concluded, is set at the counter value CL, while the input pulse width $W_{in}$ in the variable CW is initialized so as to start from 1 in so far as it is assumed that the (non-negated) pulse has started.

Then, as described in detail in what follows, a step 580 is executed in which the transition variable Dpwm is updated, and the value of PWM_old is set equal to the current value PWM_in.

Hence, in the case of negative outcome from step 520, a step 530 is executed for checking whether the value in the counter variable CW is equal to a number of clock ticks Npwm of one cycle of the PWM input signal. If it is, i.e., there is no transition and the pulse is as wide as the cycle, a step 535 is executed in which an internal variable Sat is set at 1, the pulse width $W_{in}$ is set equal to the number of clock ticks Npwm of one cycle, the width-counter variable of the negated signal CL is set at zero, as likewise the negated width $L_{in}$.

Then, the step 580 of measurement and updating is executed.

In the case of negative outcome from step 530, a step 540 is executed where the width counter CW is incremented by one, namely, CW=CW+1, and step 580 is executed.

In the case of negative outcome from step 510, a step 550 is executed to check whether the transition variable Dpwm is equal to 1.

If it is, in a step 555, the pulse width $W_{in}$ is set at a clock number of on cycle of PWM_in, which corresponds to the value of the counter CW, and a counter of the width of the negated signal CL is set at 1, i.e., $W_{in}=CW$ $CL=1$ In the case of negative outcome from step 550, in a step 560 a check is made as to whether the width counter CL is equal to the clock number Npwm.

In the case where the outcome is positive, a step 565 is executed in which an internal variable Sat is set at 1, the negated width $L_{in}$ is set equal to the clock number Npwm, the width counter CW is set at zero, as likewise the width $W_{in}$ of the input pulse.

$Sat=1$ $L_{in}=Npwm$ $CW=0=W_{in}$

In the case of negative outcome from step 530, a step 540 is executed where the negated-width counter CL is incremented by 1, namely, CL=CL+1.

Then, the updating step 580 is executed.

The updating step 580 is followed by end of the procedure.

Consequently, according to the procedure 500, from the input signal PWM_in, with an operation 510 there are calculated the intermediate variables for the pulse widths $W_{in}$, $L_{in}$, via the respective counters CW, CL and the variable Dpwm that indicates whether there has been a transition from 0 to 1 or from 1 to 0 of the input signal PWM_in, this information being obtained via storage of the input at the previous instant PWM_old.

The procedure 500 is basically applied by block 271 under the control of the control module 275 and provides the measurements of the widths $W_{in}$, $L_{in}$, as well as the measurement value of the transition variable Dpwm; i.e., it is measured whether there has been a transition or not of the input signal PWM_in and update of the current value of input signal PWM_in used by the modulation procedures 500, 600, 700.

Figure 8:
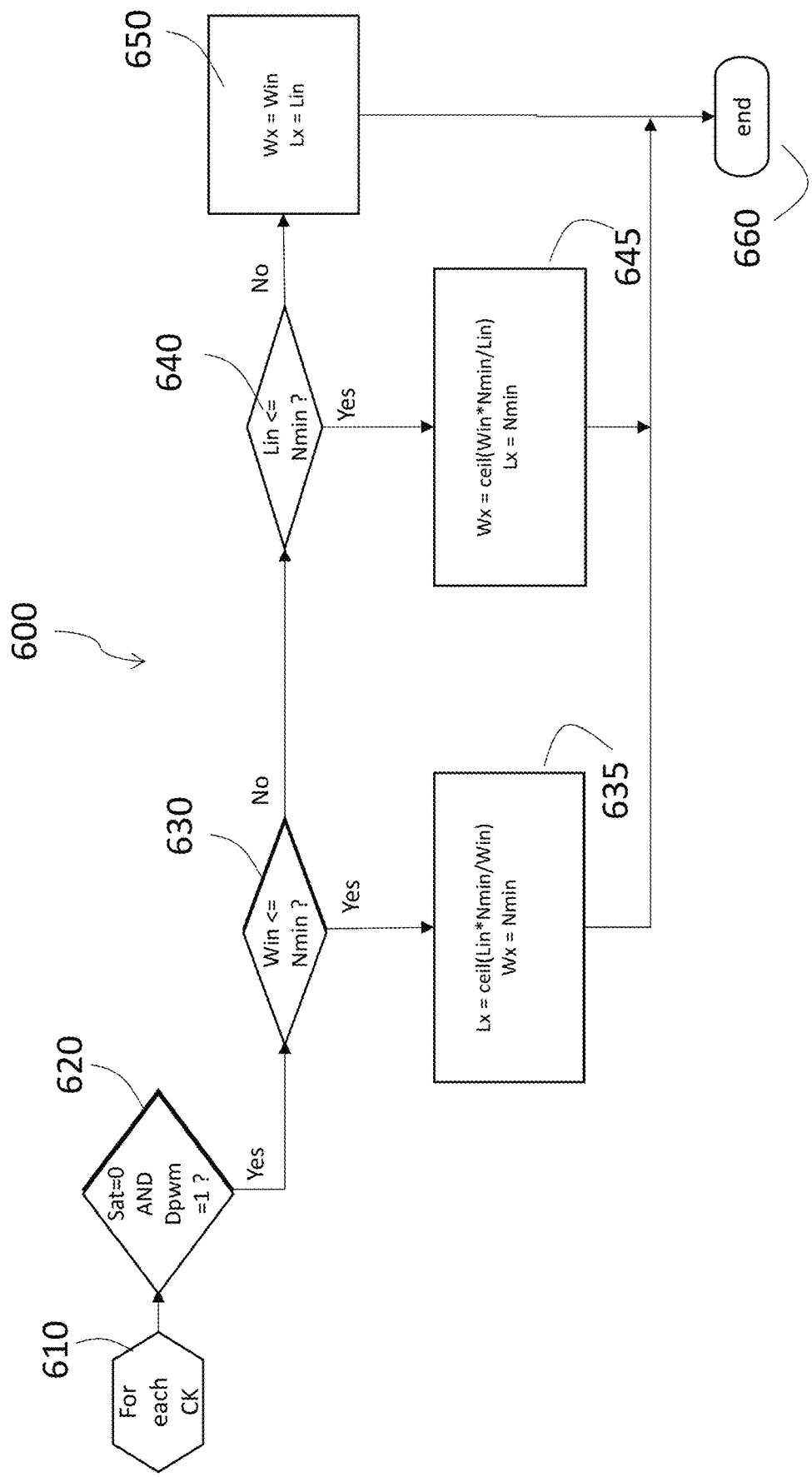

FIG. 8 represents the flowchart of a procedure 600 applied by the measurement block 272, under the control of the control module 275, which calculates the intermediate variables $L_X$ and $W_X$ and then enables calculation of the period intermediate variable Tx of the remodulated signal. Once the intermediate variables $T_X$, $L_X$, and $W_X$ have been calculated, which correspond to the new remodulated PWM signal that is to be generated, i.e., the output signal PWM_out, in FIG. 9 a procedure 700 is described, which generates the output signal PWM_out, via values CntW and CntL of counters, for example internal to block 273.

Also here the internal variable Sat and the constants Npwm (number of ticks of the clock CK of one cycle of PWM_in), Nmin (number of ticks of the clock CK corresponding to the minimum time Tmin) are indicated.

Specifically, the procedure 600 envisages in step 610 execution of a set of instructions at each clock cycle.

It should be noted that the procedures 500, 600, 700 are here indicated as being executed at each clock cycle purely by way of preferential example, for the case provided as example in which there exists a discrete-time control circuit, operating according to the signal of the clock CK. In addition, the measurement of the pulse widths can be carried out at a minimum rate, at each edge of the input signal PWM_in.

For each clock cycle, an operation 620 is hence executed to check whether the internal variable Sat is set at zero and the transition variable Dpwm is set at 1, i.e., whether in the current clock cycle a rising edge has been detected.

If it has, a step 630 is executed to check whether the input pulse width $W_{in}$, calculated in the procedure 500, is less than or equal to a width indicated by the clock number Nmin corresponding to the minimum rise/fall time Tmin.

If it is, a measured negated width value $L_X$ is calculated 635 as ceiling function, i.e., as the least integer greater than or equal to the product of the width of the negated input pulse $L_{in}$, measured with the procedure 500, and the ratio between the clock number Nmin and the input pulse width $W_{in}$. The measured pulse width $W_X$ is set equal to the clock number Nmin.

$L_X=\text{ceil}(L_{in} \cdot Nmin/W_{in})$ $W_X=Nmin$

The procedure terminates with the end step 660.

In the case of negative outcome from step 630, a step 640 is executed to check whether the width of the negated input pulse $L_{in}$ is smaller than or equal to a width of the clock pulse Nmin corresponding to the minimum rise/fall time Tmin.

If it is, a step 645 is executed to calculate a value of measured width $W_X$ as ceiling function, i.e., as the least integer greater than or equal to the product of the input width $W_{in}$ and the ratio between the clock number Nmin and the width of the negated pulse input $L_{in}$. The measured pulse width $W_X$ is set equal to the clock number Nmin.

$W_X=\text{ceil}(W_{in} \cdot Nmin/L_{in})$ $L_X=Nmin$

The procedure terminates with the end step 660.

In the case of negative outcome from step 640, the value of measured width $W_X$ is set at the value of the input pulse width $W_{in}$, and the value of measured width of the negated pulse $L_X$ is set at the value of the width of the negated input pulse $L_{in}$.

$W_X=W_{in}$ $L_X=L_{in}$

The procedure terminates with the end step 660.

The procedure 600 is executed in parallel with the procedure 500 at each tick of the clock CK. For each tick of the clock CK the check 620 is made, and then possibly the variables $W_X$ and $L_X$ used in the procedure 700 are updated, this procedure being described hereinafter and being, in turn, executed in parallel, on the basis of the variables available in the current clock period.

As regards the procedure 700, step 710 indicates execution of a set of instructions at each clock cycle. For each clock cycle, there is hence executed an operation 720 to check whether the internal variable Sat is set at 1.

If it is, in a step 730, a check is made as to whether the input pulse width $W_{in}$ (measured in the procedure 500) is equal to the number Npwm of clock ticks of one cycle of the input signal PWM_in.

If it is, in a step 735 the value of the width counter CntW in block 274 is set at the number Npwm of clock ticks in a cycle of the input signal PWM_in, whereas the value of the negated-width counter CntL, once again in block 274, is set at zero:

$$CntW = Npwm$$

$$Cnt_L = 0$$

Then, in a step 750 the output signal PWM_out is set at 1.

In the case of negative outcome from step 730, then in a step 740 the value of the pulse-width counter CntW is set at zero, whereas the value of the negated-width counter CntL is set at the number Npwm of clock ticks of one cycle of the input signal PWM_in:

$$CntW = 0$$

$$CntL = Npwm$$

Then, in a step 790 the output signal PWM_out is set at 0.

In the case of negative outcome from step 720, a step 760 is executed to check whether the value of the pulse-width counter CntW is greater than 1.

In the case of positive outcome from step 760, in a step 765 the value of the pulse-width counter CntW is decremented by 1, and then in a step 750 the output signal PWM_out is set at 1.

In the case of negative outcome from step 760, a step 770 is executed to check whether the value of the pulse-width counter CntW is equal to 1.

If it is, in a step 775 the value of the negated-pulse-width counter CntL is set at the value of the measured width of the negated pulse $L_X$; then step 765 is executed, where the value of the pulse-width counter CntW is decremented by 1, and then in a step 750 the output signal PWM_out is set at 1.

In the case of negative outcome from step 770, a step 780 is executed to check whether the value of the negated-pulse-width counter CntL is greater than zero.

In the case of positive outcome from step 770, in a step 775 the above value of the negated-pulse-width counter CntL is decremented by 1, and then in a step 790 the output signal PWM_out is set at 0.

In the case of negative outcome from step 780, in a step 787 the value of the pulse-width counter CntW is set at the value of the measured pulse width $W_X$, then in a step 750 the output signal PWM_out is set at 1.

After steps 750 and 790, which respectively set at 1 or at 0 the output signal PWM_out, the procedure reaches the end step 800 for that clock cycle.

Illustrated in FIG. 10 is a timing diagram, which shows, as a function of time t, in particular as a function of the ticks N of the clock, quantities regarding the implementation described by the flowcharts of FIGS. 7, 8, and 9. From top down, there appear the input signal PWM_in, the value of the counter variables CW and CL, the output signal PWM_out, the value of the width counter CntW and the value of the negated-pulse-width counter CntL. The width $W_{in}$ of the input signal PWM_in is less than the minimum value $W_{min}$, and decreases; it may thus be seen how the width $W_{out}$ remains constant at the value $W_{in}$, and the period $T_{out}$ increases, according to Eq. 2.2.

Each process can be performed in a clock cycle, except possibly for calculation of the measured period $T_X$, which entails a division and a multiplication.

As a result of the way in which the procedure 600 has been implemented, the measured period Tx, namely, the period of the new output pulse, is updated when the widths $W_{in}$ (step 630) or $L_{in}$ (step 640) drop below the minimum rise/fall time Tmin (represented by the number of ticks of the clock CK Nmin), only when there are transitions of the input signal PWM_in (check made in step 620). The result is a possible delay in updating of the measured widths $W_X$ and $L_X$ that does not cause problems of any sort in so far as the measured widths $L_X$ and $W_X$ are updated in an asynchronous way in the counter of FIG. 6.

If, instead, $W_{in}$ and $L_{in}$ are greater than Tmin (i.e., negative outcome from steps 630 and 640), $W_X$ is set equal to $W_{in}$ and $L_X$ is set equal to $L_{in}$ (step 650), in such a way that the output signal PWM_out is regenerated starting from the value of the output counter without forcing PWM_out=PWM_in, which enables an optimal synchronization between the output signal PWM_out and the input signal PWM_in but for a phase delay between the two, equal to a fraction of the period Tpwm of the modulation signal.

It should be noted that in the calculation of the measured period $T_X$, as a result of the presence of a division, a truncation is made. According to the requirements, it is possible to add computing means for storing and retrieving the truncated part, which is to be considered in the next cycle, together with the truncated part coming from the previous cycle.

For the second embodiment, an implementation of Eq. 3.2 in the time-Discrete analog field, which hence does not incur in problems of temporal quantization, it can be based on various multiplier architectures, amongst which translinear circuits that use the equations of components such as bipolar transistors (Gilbert cell) or CMOS transistors, but, considering the temporal nature of the quantities at input/output, there appears preferable an implementation by means of an analog multiplier cell of a time-mode type, which simultaneously generates the desired product as discrete-amplitude pulse (logic level 0 or 1), the duration of which satisfies Eq. 3.2., namely, $L_{out} \cdot W_{in} = L_{in} \cdot W_{min}$.

Examples of such multiplier cells may be found, for instance, in R. D'Angelo and S. Sonkusale "*Analogue multiplier using passive circuits and digital primitives with time-mode signal representation*", ELECTRONICS LETTERS 22 Oct. 2015, Vol. 51, No. 22, pp. 1754-1756.

Figure 11:
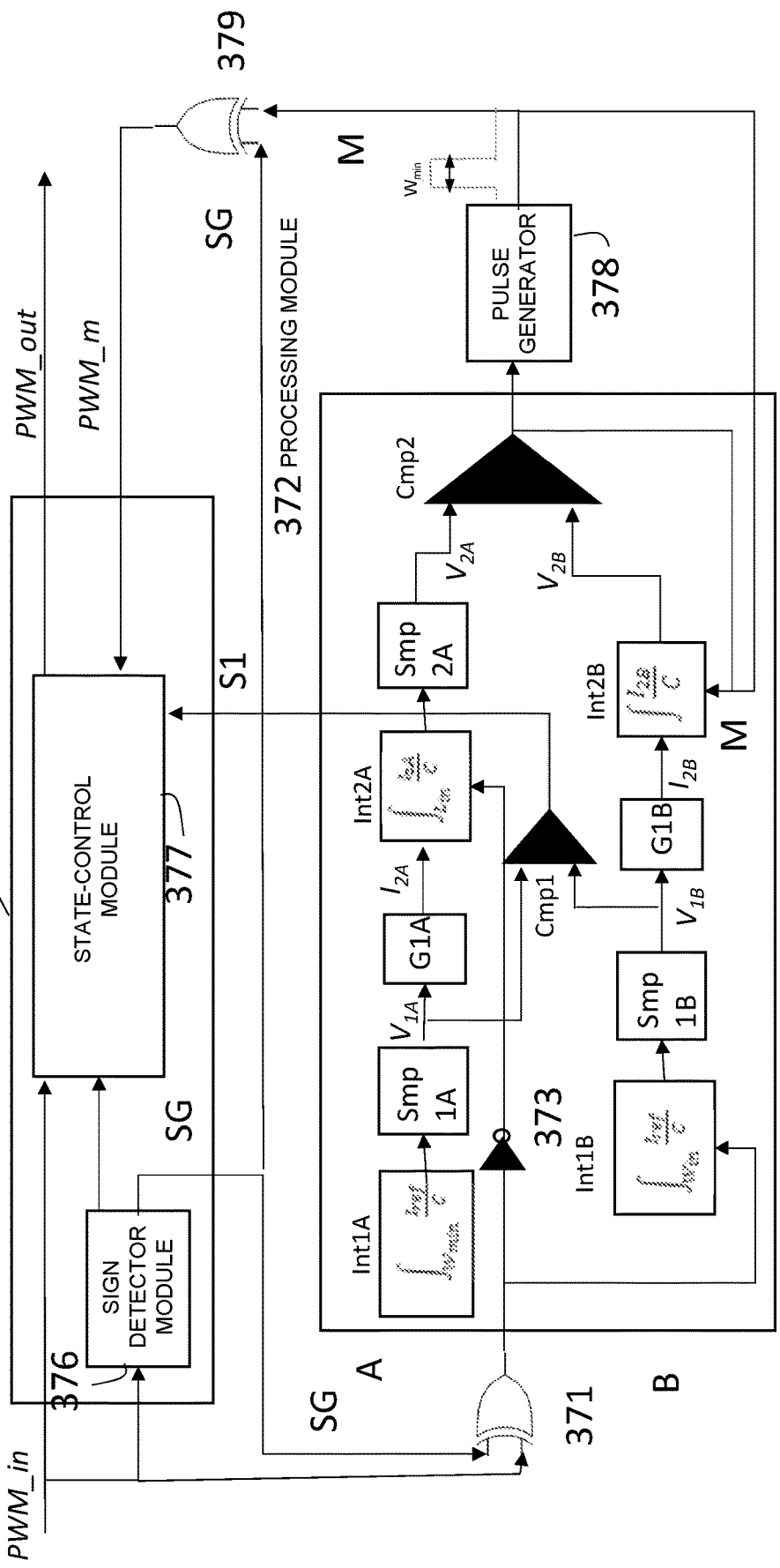
FIG. 11 illustrates a diagram of a further embodiment of the module operating in the circuit arrangement according to the solutions described herein.

Illustrated schematically in FIG. 11 is an embodiment 37 of the modulator of an analog type, which uses Eq. 3.2.

Designated by 375 is a logic control module, which comprises a module 376 configured for measuring the sign of the input signal PWM_in and a state-control module 377, both of which receive the input signal PWM_in.

The modulator 37 further comprises a PWM-signal processing module 372, which receives at input the result of the XOR operation between the input signal PWM_in and the output of the module 376 configured for measuring the sign SG of the input signal PWM_in calculated by a corresponding XOR gate 371. The way in which the sign SG of the signal is calculated is explained in what follows.

The processing module 372 comprises two branches A and B, one dedicated to processing regarding the minimum width $W_{min}$, and the other dedicated to processing regarding the input pulse width $W_{in}$, which comprise two respective integrator stages Int1a and Int1b, in which two capacitors having a capacitance C are charged, starting from a discharged condition, for a time equal to $W_{min}$ and $W_{in}$, respectively, at constant current, via a reference current Iref. Respective samplers Smp1A and Smp1B sample the voltages that are set up at output from the integrator stages Int1a and Int1b on the capacitors C and supply them at output as sampled voltages, respectively $V_{1A}$ and $V_{1B}$. These sampled voltages $V_{1A}$ and $V_{1B}$ are the inputs of:

a first comparator Cmp1, which checks whether $W_{in}<W_{min}$, i.e., whether $V_{1B}<V_{1A}$, supplying the result of the comparison to the control logic 275 as switching signal S1; and subsequent current generators G1A, G1B controlled in voltage of transconductance G, which convert the above voltages $V_{1A}$ and $V_{1B}$ into currents $I_{2A}$ and $I_{2B}$ supplied to respective subsequent second integration stages Int2A and Int2B.

In the second integrator Int2A, a capacitor C is charged for a time equal to the width of the negated input pulse $L_{in}$, and the resulting voltage is sampled as voltage $V_{2A}$ by a second sampler Smp2A. The integrator Int2A starts to undergo charging by the signal at output from the XOR gate 371, which is supplied through an inverting gate 373, which thus negates the input signal, enabling operation on the negated pulse.

At output from the integrator Int2A we obtain:

$$V_{2A}=W_{min} \cdot L_{in} \cdot Iref \cdot G/C^2$$

A generator 378 for generating a pulse M of duration $W_{min}$, set at the output of the processing module 372, as described more fully in what follows, controls, with the falling edge of the respective pulse M, start of the second integrator Int2B through the output, which charges a capacitor C with the current $I_{2B}$ starting from a discharged condition.

The voltage $V_{2B}$ on the capacitor as a function of time is:

$$W_{in} \cdot t \cdot Iref \cdot G/C^2$$

A second comparator Cmp2 compares the voltages $V_{2A}$ and $V_{2B}$. Its output signal governs the generator 378 that generates the pulse M of duration $W_{min}$ in such a way that the second comparator Cmp2 interrupts charging of the capacitor C when $V_{2B}=V_{2A}$ and restarts generation of the pulse M of duration $W_{min}$. The above restarting instant is $t=W_{min} \cdot L_{in}/W_{in}$, i.e., the instant t corresponds to the width of the negated output pulse $L_{out}$ such as to satisfy Eq. 3.2.

Use of the samplers Smp enables execution of the operations of sampling of the input signal ($W_{in}$ and $L_{in}$) in an asynchronous way with generation of the width $L_{out}$.

The voltage $V_{1A}$, which is the integral of the minimum width $W_{min}$, may be obtained at a rate that is generally lower as compared to the signals $W_{in}$ and $L_{in}$ in so far as it is sufficient to guarantee temperature matching of the capacitor C and of the current generator $I_{ref}$ (neither of which is illustrated in the figures) with the rest of the circuits. The duration of the minimum width $W_{min}$ may be made to vary according to the requirements of the driver 13, which is controlled by the output signal PWM_out. At high temperature, for example, it is convenient to increase it in order possibly to keep up with the reduced speed of the drivers 13. The capacitors of the other integrators may, in variant embodiments, be reset to zero by a logic in the intervals of the pulse in which they are not active, i.e., Int2A during the time $W_{in}$, Int1B during the time $L_{in}$, and Int2B during the time $W_{min}$.

The generator 378 for generating the pulse of duration $W_{min}$ supplies its output to an XOR gate 379, together with the output SG of the sign detector 376. The output of the XOR gate 379 is supplied to the logic control module 375 and represents a modified PWM signal PWM_m.

The logic control module 375 selects the desired PWM signal from between the PWM input signal PWM_in and the modified PWM output signal PWM_m, as output signal PWM_out on the basis of Eqs. 2.1, 2.2 or Eq. 2.3, i.e., according to whether the input pulse width $W_{in}$ falls within the interval [$W_{min}$, $W_{max}$], preventing undesired discontinuities and spurious transitions on the filtered output signal.

Figure 13:
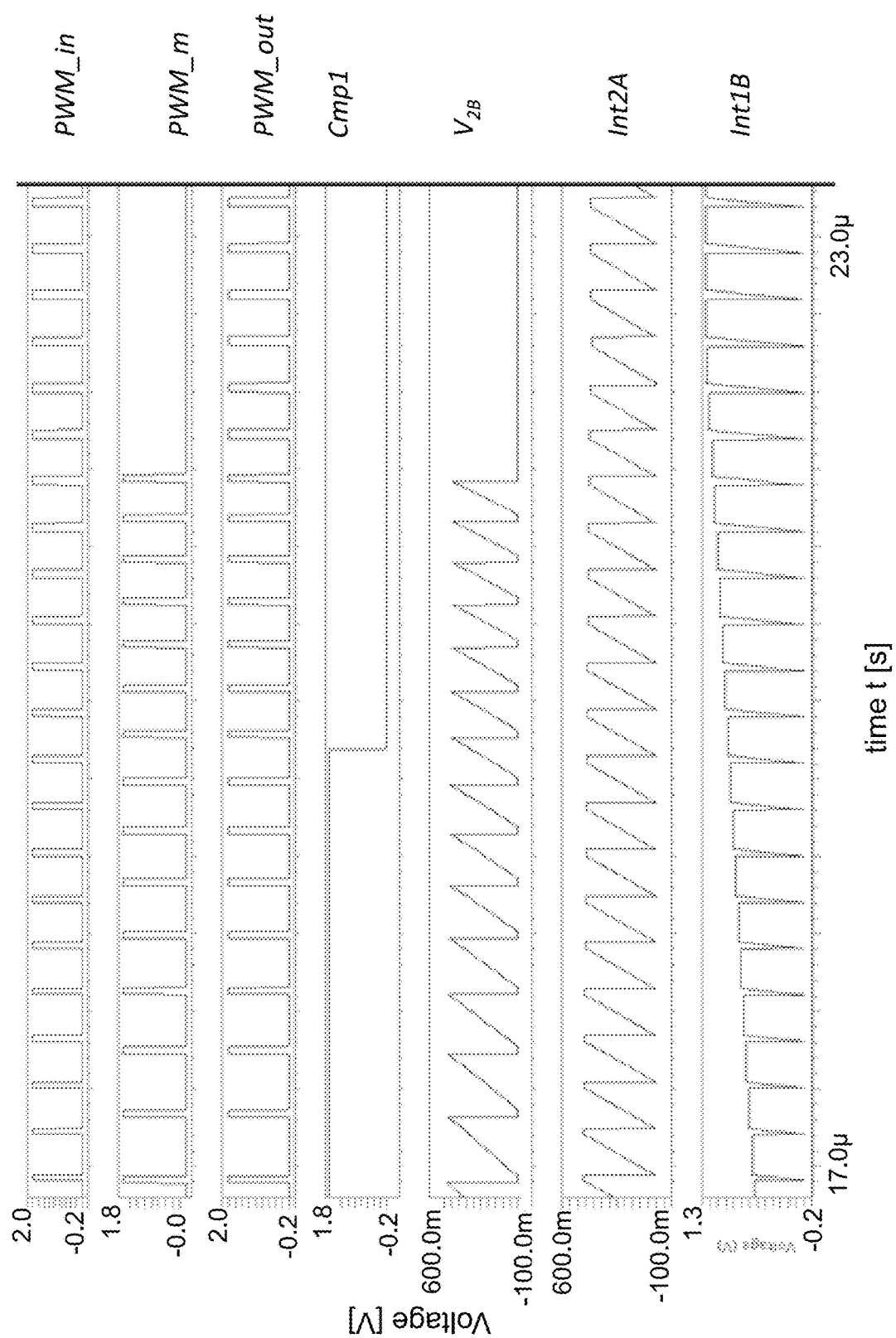

Passage from modulation with variable period (PWM determined by Eq. 2.2 or Eq. 2.3) to modulation with fixed period (PWM determined by Eq. 2.1) and vice versa, can be managed in the following ways:

causing the PWM input signal PWM_in to be supplied directly as output signal PWM_out upon passage from conditions of saturation, given by Eqs. 2.2 and 2.3, to a normal PWM ($W_{min} \leq W_{in} \leq W_{max}$); it is expedient to avoid a sharp transition (controlled by just the first comparator Cmp1), prearranging the control logic 375 in such a way that, starting from the signal of the first comparator Cmp1, there is a wait time sufficient for the rising (or falling) edges of the input signal PWM_in and of the modified PWM signal PWM_m to be phase delayed but for a given delay, as emerges from the waveforms in FIG. 13; in this wait time interval it is possible for the modified PWM signal PWM_m to have a higher frequency than the PWM input signal PWM_in; in this case, when the period $T_{in}$ of the input signal PWM_in is reselected at output, there may occur a short spurious transient, the main harmonic components of which fall beyond the audio band;

forgoing having the input signal PWM_in in phase with the output signal PWM_out also for $W_{min} \leq W_{in} \leq W_{max}$, recreating, starting from the input signal PWM_in a signal that is delayed as required according to the state of the edges of the output signal PWM_out present at the moment of passage between the conditions of Eqs. 2.2 and 2.3 and the condition of Eq. 2.1, i.e., when the input pulse width $W_{in}$ falls within the interval [$W_{min}$, $W_{max}$]; it is possible to obtain the desired effect in many different ways, for example using controlled delay lines for applying the delay.

Figure 12:
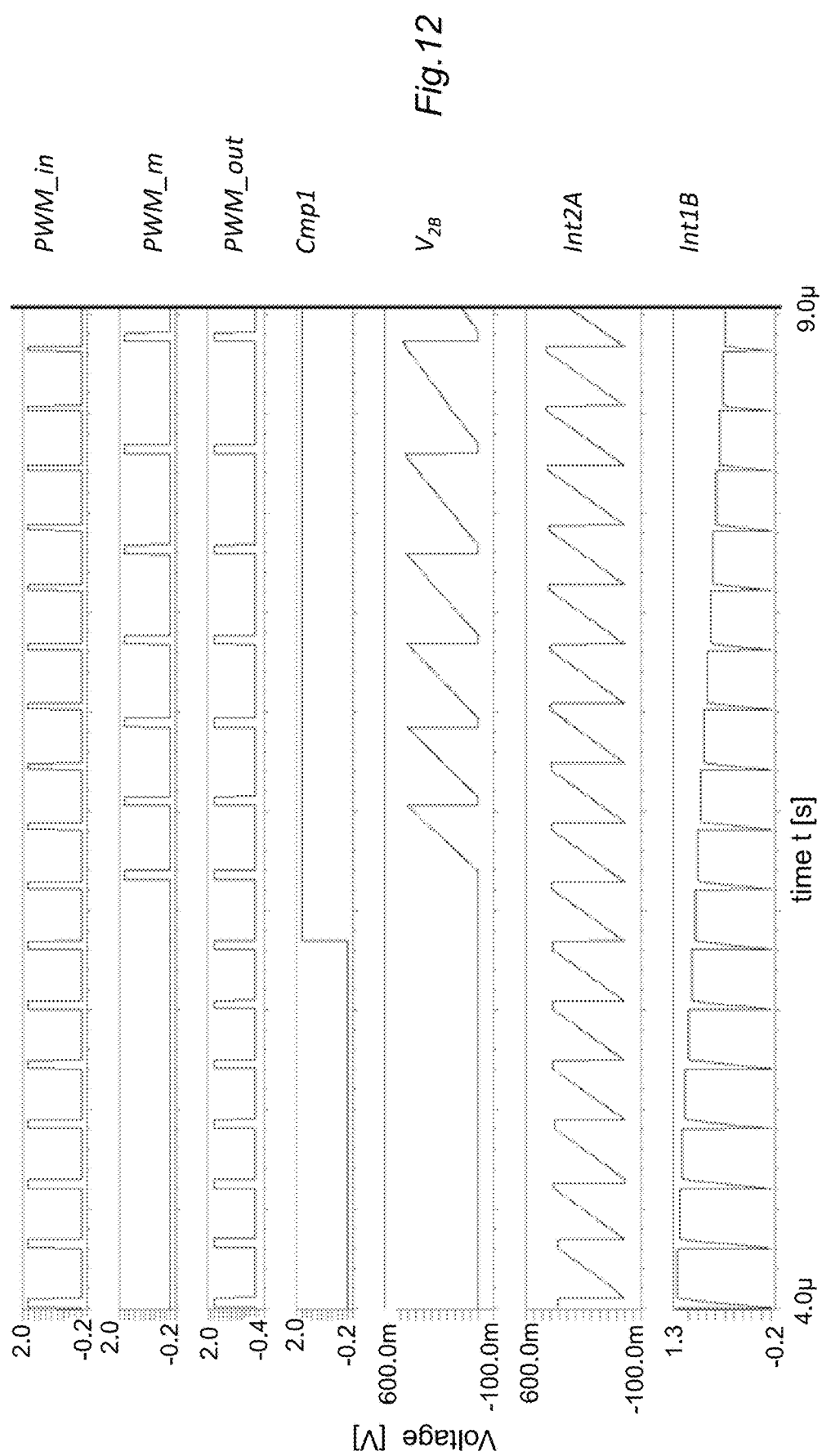
FIGS. 12 and 13 illustrate timing diagrams of signals used by the circuit of FIG. 11.

With reference to the diagram of the modulator 37 of FIG. 11 and to the corresponding waveforms presented in the timing diagrams of FIGS. 12 and 13, it is expedient to implement a system that will process Eq. 3.2 only in the case of input pulse with width $W_{in}<W_{min}$ (saturation towards zero or ground voltage GND), it being possible to obtain the reverse case (saturation at the supply voltage VCC) from the first case by negating the input signal, processing the signal as if it were of minimum duration, and negating the output thus obtained.

It is, in fact, possible to proceed as in the case $W_{min}$ once the sign signal SG is generated in the module 376, as follows:

$$SG=0 \text{ if } W_{in}/T_{in}<\frac{1}{2},$$

$$SG=1 \text{ otherwise}$$

i.e., the sign signal SG switches from zero to one if the ratio between the pulse width $W_{in}$ and the period $T_{in}$ of the input signal PWM_in is greater than 0.5; then, the XOR operation 371 between the input signal PWM_in and the sign function SG is considered. If this operation is performed also on the output, i.e., a XOR operation 379 is carried out between the sign function SG and the output signal PWM_out, it is possible to simplify the remodulator 37 for processing only signals of minimum duration to obtain the desired signal in both cases (minimum duration and maximum duration).

As may be seen and as already mentioned previously, the remodulator 37 comprises a processing block 372, which operates only with the width $W_{min}$, but the input signal PWM_in is negated at input, via the gate 371, if the sign signal SG indicates that the pulse width is greater than one half of the period, and hence the upper limit of the interval represented by the maximum width $W_{max}$ is concerned. The negated signal $\overline{PWM\_in}$ is then treated by block 372 with $W_{min}$, which corresponds to $T_{in}-W_{max}$, and is again negated via the XOR operation 376, which negates the signal M to obtain the modified signal PWM_m. If the sign signal SG were 0, the XOR gates 371 and 379 could be removed.

Illustrated in FIG. 12 is a timing diagram that shows as a function of the time t quantities regarding the implementation of FIG. 11. Shown from top down are the input signal PWM_in, the modified signal PWM_m, the output signal PWM_out, the output of the first comparator CMP1, the voltage $V_{2B}$, and the outputs of the integrators Int2A and Int1B. The transition to the high level of the first comparator CMP1 in the switching signal S1 indicates where the width $W_{in}$ in the input signal PWM_in is less than the minimum value $W_{min}$ and hence where the output signal PWM_out passes from corresponding to the input signal PWM_in to corresponding to the modified signal PWM_m.

FIG. 13 shows the opposite transition, namely, the transition to the low level of the first comparator CMP1, which indicates where the width $W_{in}$ in the input signal PWM_in exceeds the minimum value $W_{min}$ and hence where the output signal PWM_out passes from corresponding to the modified signal PWM_m to corresponding to the input signal PWM_in.

Figure 14:
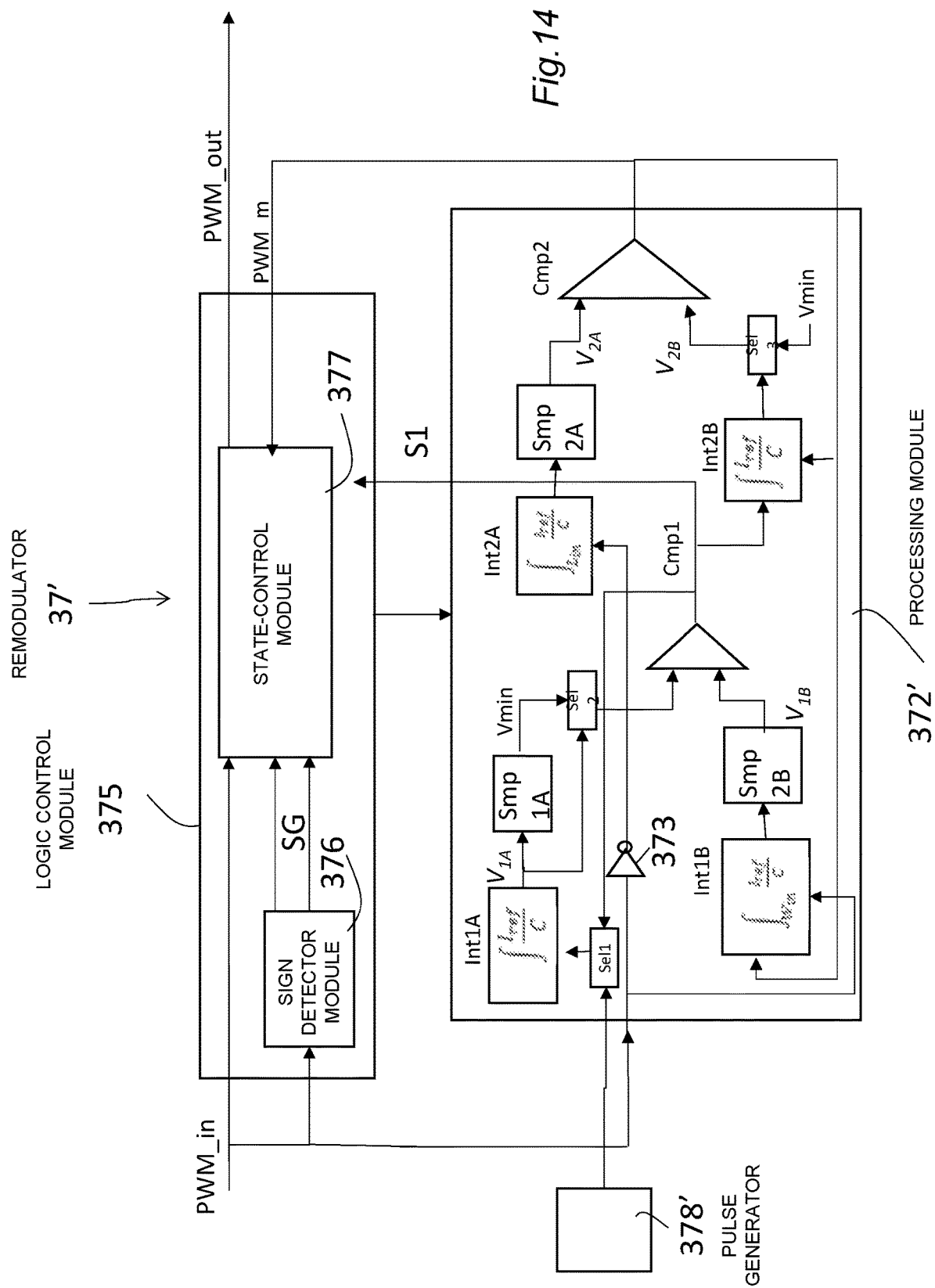
FIG. 14 illustrates a diagram of a variant of the embodiment of FIG. 11.

Illustrated in FIG. 14 is a remodulator 37', which results from a reconnection of the blocks of the circuit 372 in the remodulator 37 in FIG. 11.

In practice, the circuit of FIG. 14 corresponds to the circuit of Figure ii, but the XOR gates 371 and 379 are not present. Consequently, the input signal PWM_in goes directly to the inverter 73, which generates the negated signal $\overline{PWM\_in}$ for computing the width of the negated pulse $L_{in}$. A pulse generator M of minimum width $W_{min}$ 378' is set at the input of a processing block 372', instead of at output from the second comparator Cmp2, as in FIG. 11, to supply its own pulse M of duration $W_{min}$ to a selector switch Sel1, which selects between this signal M and the output of the first comparator Cmp1 for governing start of the integrator Int1. Further selector switches are provided: Sel2, which selects, from between the output of the integrator Int1, i.e., the non-sampled voltage $V_{1A}$, and the output of the sampler Smp1, i.e., the sampled voltage here denoted as $V_{min}$, the voltage supplied at input as $V_{1A}$ to the comparator Cmp1; and Sel3, which selects, from between the output of the integrator Int2b and the voltage $V_{min}$, the signal to be sent as voltage $V_{2B}$ to the second comparator Cmp2. The output of the second comparator Cmp2 is sent directly to the integrators Int1, Int2, instead of the output of the generator 378 of FIG. 11.

The samplers Smp1B and Smp2A of the integrators Int1B and Int2A in fact enable storage of the information on the voltages $V_{1B}$ and $V_{2A}$ that represent the widths of the input pulses in an asynchronous way. The delayed edges are determined via current generators Iref, which charge capacitors C until the sampled voltage $V_{1A}$ and $V_{1B}$ are reached. Transition of the first comparator Cmp1 (or the second comparator Cmp2) starts the block corresponding to the next delayed edge, Int2b (or else Int1A).

The integrator Int1A also functions as comparator of the width $W_{min}$, which is stored as voltage Vmin in the sampler Smp1. The comparison between the input width $W_{in}$ (or $L_{in}$) and the minimum width $W_{min}$ may be made via the selectors switches Sel1, Sel2, Sel3, when the comparators Cmp1 or Cmp2 are not generating the delayed edge.

Hence, the advantages of solutions described emerge clearly.

The solutions described enable extension of the linear range of the high-frequency pulse-width modulator far beyond what can otherwise be obtained: it would pass from 10-20% of the traditional system to 1-2% of the solutions proposed.

Moreover, the circuit arrangements presented are markedly independent of the electrical parameters of the real elements considered, and mostly of the mismatch between homologous components, which can be easily controlled in integrated CMOS technology.

Whereas the system of feed-back control of saturation, when in action, determines RF emissions mostly on peaks at harmonics Fpwm/2 Fpwm/3, etc., the system proposed entails a continuous-spectrum emission at frequencies distributed between Fpwm and Fpwm/N, where N can be controlled on the basis of the parameters established for the desired minimum modulation ratio (W/Tpwm).

Given the same RF energy emitted, a continuous spectrum is in general more acceptable, as regards emission specifications, than a spectrum constituted by peaks.

The system moreover enables a communication outwards that is much more precise in the condition of saturation of the amplifier.

Without prejudice to the underlying principles, the details of construction and the embodiments may vary, even significantly, with respect to what has been illustrated herein purely by way of non-limiting example, without thereby departing from the sphere of protection, as this is defined in the annexed claims.

What is claimed is:

1. A pulse-remodulator circuit comprising:
   a logic control module configured for:
      receiving an input signal pulsed between two electrical levels;
      selecting, based on a switching signal, between the input signal and a modified signal, to provide an output remodulated signal pulsed between the two electrical levels; and
      supplying, as a driving signal to a switching-type output power stage, the output remodulated signal;
   a pulse generator configured for providing a first signal having a pulse of minimum width to a comparator and multiplier module; and
   the comparator and multiplier module, configured for:
      receiving the input signal;
      receiving the first signal having the pulse of minimum width;
      generating the switching signal for the logic control module based on the input signal and the first signal; and
      generating, independent of the output remodulated signal, the modified signal having a pulse of the minimum width and a period determined by imposing equality between a product of the minimum width and a width of a negated input pulse and a product of the period and a width of the input pulse.

2. The pulse-remodulator circuit according to claim 1, wherein the comparator and multiplier module comprises:
   a first selector switch configured for receiving the first signal and an output of a first comparator, and configured for governing a start of a first integrator; and
   the first integrator, coupled between the first selector switch and the first comparator, and configured for generating a first unsampled voltage representative of the minimum width.

3. The pulse-remodulator circuit according to claim 2, wherein the comparator and multiplier module comprises:
a first sampler coupled between the first integrator and the first comparator, and configured to store a first sampled voltage representative of the minimum width.

4. The pulse-remodulator circuit according to claim 3, wherein the comparator and multiplier module comprises:
a second selector switch coupled between the first sampler and the first comparator, and configured for selecting between the first unsampled voltage and the first sampled voltage.

5. The pulse-remodulator circuit according to claim 4, wherein the comparator and multiplier module comprises:
a second integrator coupled between an output of a second comparator generating the modified signal and an input of the first comparator, and configured for generating a second unsampled voltage representative of the width of the input pulse.

6. The pulse-remodulator circuit according to claim 5, wherein the comparator and multiplier module comprises:
a second sampler coupled between the second integrator and the first comparator, and configured to store a second sampled voltage representative of the width of the input pulse; and
the first comparator, configured for generating the switching signal based on an output of the second selector switch and the second sampled voltage.

7. The pulse-remodulator circuit according to claim 6, wherein the comparator and multiplier module comprises:
an inverter configured for receiving the input signal and providing a negated input signal; and
a third integrator configured for receiving the negated input signal and generating a third unsampled voltage representative of a width of the negated input pulse.

8. The pulse-remodulator circuit according to claim 7, wherein the comparator and multiplier module comprises:
a third sampler coupled between the third integrator and the second comparator, and configured to store a third sampled voltage representative of the width of the negated input pulse.

9. The pulse-remodulator circuit according to claim 8, wherein the comparator and multiplier module comprises:
a fourth integrator coupled between the first comparator and the second comparator, and configured for generating a fourth unsampled voltage representative of the switching signal.

10. The pulse-remodulator circuit according to claim 9, wherein the comparator and multiplier module comprises:
a third selector switch coupled between the fourth integrator and the second comparator, and configured for selecting between the fourth unsampled voltage and the first sampled voltage; and
the second comparator, configured for generating the modified signal based on an output of the third sampler and the third selector switch.

11. A method for controlling an electronic apparatus to carry out pulse modulation, the method comprising:
converting a continuous or digital electrical input signal into an input signal pulsed between two electrical levels and having a mean value proportional to an amplitude of the input signal;
controlling saturation of an output power signal supplied by a switching-type output stage, the controlling comprising remodulating the pulsed input signal, the remodulating comprising:
calculating intermediate variable $W_x$ representing a measured pulse width, and intermediate variable $L_x$ representing a measured negated pulse width; and
remodulating, independent of the output power signal, the pulsed input signal.

12. The method according to claim 11, further comprising, at each clock cycle, determining whether a rising edge of an input pulse has been detected.

13. The method according to claim 12, further comprising, in response to the rising edge being detected, determining whether an input pulse width $W_{in}$ is less than or equal to a width indicated by a clock number Nmin corresponding to a minimum rise/fall time Tmin.

14. The method according to claim 13, further comprising, in response to the input pulse width $W_{in}$ being less than or equal to the width indicated by the clock number Nmin:
calculating a measured negated width value $L_X$ as a ceiling function by selecting a least integer greater than or equal to a product of a width of a negated input pulse Lin and a ratio between the clock number Nmin and the input pulse width $W_{in}$; and
setting the measured pulse width $W_X$ equal to the clock number Nmin.

15. The method according to claim 14, further comprising calculating $L_x$ and $W_x$ according to:

$L_X=\text{ceil}(L_{in} \cdot N\text{min}/W_{in})$, and $W_X=N\text{min}$.

16. The method of claim 13, further comprising, in response to the input pulse width $W_{in}$ greater than the width indicated by the clock number Nmin:
checking whether a width of a negated input pulse $L_{in}$ is smaller than or equal to a width of the clock number Nmin corresponding to the minimum rise/fall time Tmin.

17. The method of claim 16, further comprising, in response to the width of the negated input pulse $L_{in}$ being smaller than or equal to the width of the clock number Nmin:
calculating a measured width $W_X$ as a ceiling function by selecting a least integer greater than or equal to a product of the input pulse width $W_{in}$ and a ratio between the clock number Nmin and the width of the negated input pulse $L_{in}$; and
setting the measured pulse width $W_X$ equal to the clock number Nmin.

18. The method according to claim 17, further comprising calculating $L_x$ and $W_x$ according to:

$W_X=\text{ceil}(W_{in} \cdot N\text{min}/L_{in})$, and $L_X=N\text{min}$.

19. The method according to claim 16, in response to the width of the negated input pulse $L_{in}$ being greater than the width of the clock number Nmin:
setting the measured pulse width $W_X$ to the input pulse width $W_{in}$; and
setting the measured negated pulse width Lx to the width of the negated input pulse $L_{in}$.

20. The method according to claim 19, further comprising calculating $L_x$ and $W_x$ according to:

$W_X=W_{in}$, and $L_X=L_{in}$.

* * * * *

UNITED STATES PATENT AND TRADEMARK OFFICE
CERTIFICATE OF CORRECTION

PATENT NO. : 11,848,675 B2
APPLICATION NO. : 18/049852
DATED : December 19, 2023
INVENTOR(S) : Gonano et al.

It is certified that error appears in the above-identified patent and that said Letters Patent is hereby corrected as shown below:

In the Claims

In Column 24, in Claim 14, Line 20, delete "Lin" and insert -- $L_{in}$ --.

In Column 24, in Claim 19, Line 52, delete "claim 16, in" and insert -- claim 16, further comprising, in --.

In Column 24, in Claim 19, Line 57, delete "Lx" and insert -- $L_x$ --.

Signed and Sealed this
Fifth Day of March, 2024

Katherine Kelly Vidal
*Director of the United States Patent and Trademark Office*